(12) United States Patent
Shivaray et al.

(10) Patent No.: US 11,879,942 B1
(45) Date of Patent: Jan. 23, 2024

(54) CORE AND INTERFACE SCAN TESTING ARCHITECTURE AND METHODOLOGY

(71) Applicant: Micron Technology, Inc., Boise, ID (US)

(72) Inventors: Banadappa Shivaray, Gulbarga (IN); Shrikrishna Pundoor, Hyderabad (IN); Mahesh Rawal, Hyderabad (IN); Aviral Agarwal, Prayagraj (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/823,670

(22) Filed: Aug. 31, 2022

(51) Int. Cl.
*G01R 31/3185* (2006.01)

(52) U.S. Cl.
CPC ............ *G01R 31/318536* (2013.01); *G01R 31/31855* (2013.01); *G01R 31/31858* (2013.01); *G01R 31/318525* (2013.01); *G01R 31/318563* (2013.01); *G01R 31/318566* (2013.01)

(58) Field of Classification Search
CPC .... G01R 31/318536; G01R 31/318525; G01R 31/31855; G01R 31/318563; G01R 31/318566; G01R 31/31858
USPC ................. 714/729, 726, 733, 742
See application file for complete search history.

(56) References Cited

U.S. PATENT DOCUMENTS

| | | | |
|---|---|---|---|
| 6,289,477 B1* | 9/2001 | Gunadisastra | ........................... G01R 31/318541 714/724 |
| 6,519,724 B1* | 2/2003 | Arnould | ......... G01R 31/318533 714/724 |
| 6,970,815 B1* | 11/2005 | Bombal | ................ G06F 11/267 716/108 |
| 8,892,971 B2* | 11/2014 | Kimura | .......... G01R 31/318541 714/731 |
| 2003/0070128 A1* | 4/2003 | Akasaka | ........ G01R 31/318544 326/62 |
| 2011/0175638 A1* | 7/2011 | Maeda | ........... G01R 31/318563 324/762.01 |
| 2012/0193621 A1* | 8/2012 | Or-Bach | .......... H03K 19/17736 257/E25.013 |
| 2012/0193681 A1* | 8/2012 | Or-Bach | .......... H03K 19/17736 257/E23.174 |
| 2014/0040688 A1* | 2/2014 | Zhang | ............ G01R 31/318541 714/E11.155 |
| 2023/0138651 A1* | 5/2023 | Kilian | .................. H03K 3/0315 714/726 |

* cited by examiner

*Primary Examiner* — John J Tabone, Jr.

(74) *Attorney, Agent, or Firm* — Harrity & Harrity, LLP

(57) ABSTRACT

Implementations described herein relate to a core and interface scan testing. In some implementations, an integrated circuit may include input scan flip-flops (ISFFs) arranged in multiple ISFF stages that include a first ISFF stage and a second ISFF stage. Inputs to the first ISFF stage are connected to inputs of the integrated circuit. Inputs to the second ISFF stage are connected to outputs of a logic component that is connected to outputs of the first ISFF stage. The integrated circuit may include output scan flip-flops (OSFFS) arranged in multiple OSFF stages that include a first OSFF stage and a second OSFF stage. Outputs from the first OSFF stage are connected to outputs of the integrated circuit. Outputs from the second OSFF stage are connected to inputs of a logic component that is connected to inputs of the first OSFF stage. The integrated circuit may include core scan flip flops.

25 Claims, 7 Drawing Sheets

US 11,879,942 B1

CORE AND INTERFACE SCAN TESTING ARCHITECTURE AND METHODOLOGY

TECHNICAL FIELD

The present disclosure generally relates to integrated circuit design for testing and, for example, to a core and interface scan testing architecture and methodology.

BACKGROUND

Design for testing (DFT) includes various integrated circuit design techniques that add testability features to a hardware product design. These added features lead to easier development and application of manufacturing tests for the designed hardware. The purpose of a manufacturing test is to validate that the hardware does not have any manufacturing defects (or that any defects satisfy acceptable limit) that would lead to malfunction of the hardware. A test may be applied at one or more steps of the hardware manufacturing process, and may also be used to periodically test the hardware after deployment (e.g., in the customer's environment). A test may be driven by a test program that executes using automatic test equipment (ATE) or, in the case of testing after deployment, inside the assembled system itself.

Scan design is one method for delivering test data from integrated circuit inputs to internal circuits under test (CUTs) and observing outputs of those CUTs. In scan design, registers (e.g., flip-flops or latches) in the designed hardware are connected in one or more scan chains, which are used to gain access to internal nodes of the integrated circuit. Test patterns are shifted in via the scan chains, either functional clock signals (e.g., for an at-speed test mode) or scan clock signals (e.g., for a stuck-at test mode) are pulsed to test the circuit during a capture cycle, and the outputs from the internal nodes are then shifted out to output pins and compared against expected results (e.g., results that are expected when the integrated circuit is operating correctly). If the output is the same as the expected result, the circuit passes the test. Otherwise, the circuit fails the test and is not operating as intended.

DETAILED DESCRIPTION

Figure 1:
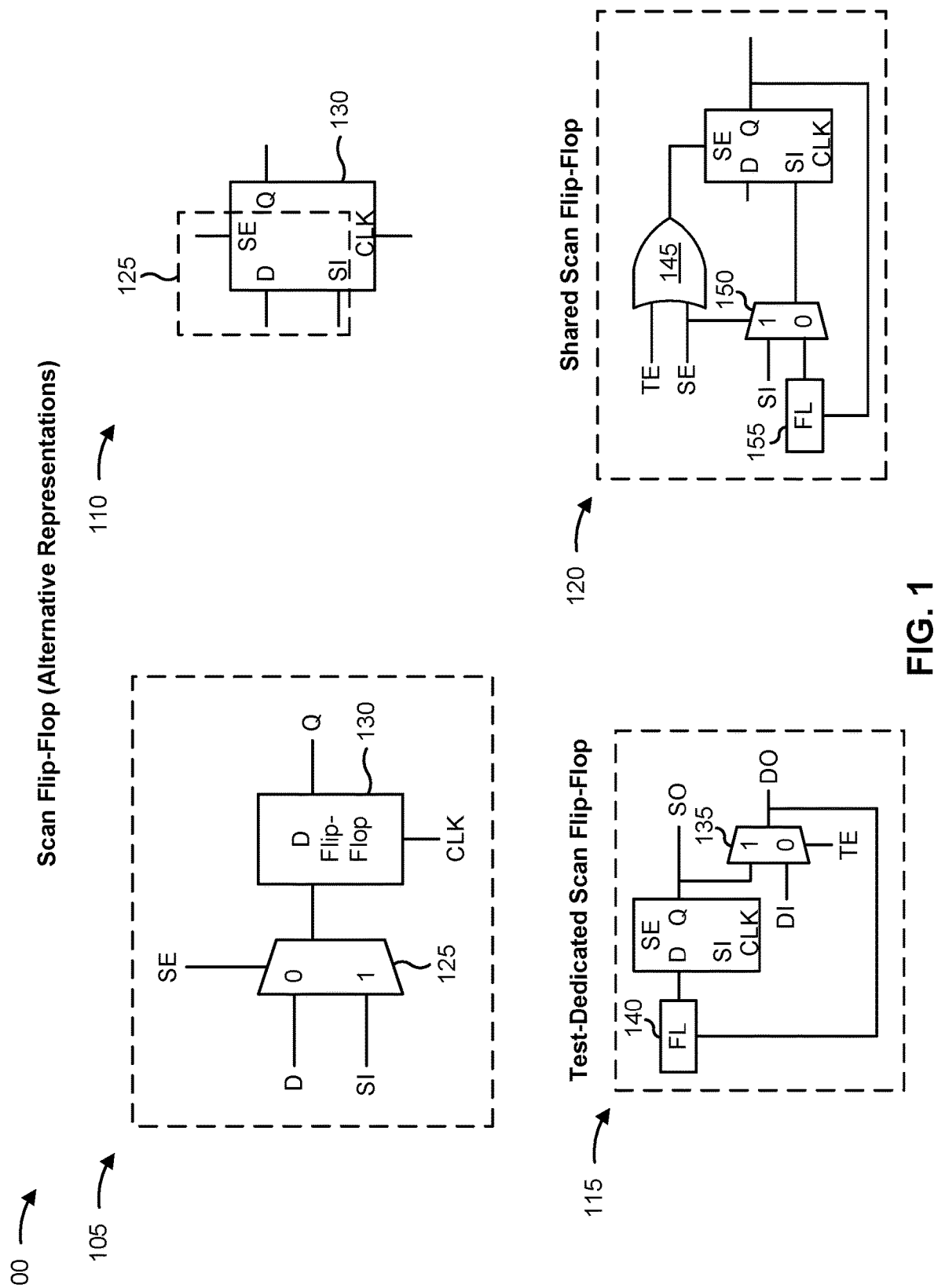
FIG. 1 is a diagram of a scan flip-flop.

A system on a chip (SoC) is an integrated circuit (sometimes called a "chip") that integrates all or many components of an electronic system, such as a computer. An SoC includes a variety of components, sometimes called "cores," that are tightly integrated with one another to improve performance, reduce power consumption, and/or reduce semiconductor die area as compared to a multi-chip design with equivalent functionality as the SoC. Examples of SoC components or cores include a central processing unit (CPU), a memory device, an input/output device, a modem or other type of communication component, a graphics processing unit (GPU), a storage system, a digital signal processor (DSP), or the like.

Testing of an SoC (or another type of integrated circuit) may be accomplished using design for testing, where components used for testing the SoC are integrated within the SoC hardware. For example, scan flip-flops in the designed hardware may be connected in one or more scan chains that can be used to gain access to internal nodes (e.g., functional logic or circuits) of the SoC and to test individual cores of the SoC or interfaces between cores of the SoC. A testing component (e.g., included in the SoC or external from the SoC) may load the scan flip-flops with test data (e.g., a test pattern) and then apply (e.g., pulse) one or more clock signals to test cores or interfaces during a capture cycle. A test output may be captured by other scan flip-flops and provided to the testing component, which may compare the test output with an expected output to determine whether the core or interface is correctly operating.

One technique for such testing is to include wrapper cells (sometimes called core wrapper cells) at the inputs and outputs of a core. A wrapper cell includes a scan flip-flop (described in more detail below) and a multiplexer to enable switching between a functional mode (e.g., a non-test mode in which the core operates normally) and a test mode, such as a core-internal test mode that tests the core or a core-external test mode that tests an interface between cores. The wrapper cell enables access to nodes of the core for input of test data and capture of test outputs. However, in some cases, wrapper cells do not permit efficient "at-speed" testing, in which a test is performed using the functional clock frequency (e.g., the clock frequency used during the functional mode), because the wrapper cells are operated using low speed clocks during the test mode (rather than a high speed clock used during the functional mode). For example, a test-dedicated wrapper cell (e.g., capable of operating in only a test mode and not a functional mode) cannot be used to perform at-speed testing because test-dedicated wrapper cells are not on the functional data path of an integrated circuit. Using a shared wrapper cell (e.g., capable of being toggled between a test mode and a functional mode) for at-speed testing results in timing overhead because input shared wrapper cells use a low clock frequency to load (or shift) test data into a scan chain, while during capture the input shared wrapper cells need to shift with respect to a high frequency functional clock for an at-speed test. Some techniques for at-speed testing in an internal test ("IN-TEST") mode and an external text ("EXTEST") mode result in component overhead (e.g., additional components that need to be added to the design), loss of test coverage (e.g., where not all nodes are properly tested), and/or pattern count inflation (e.g., where a greater number of test patterns are needed to properly test all nodes).

Some implementations described herein enable at-speed core and interface testing of an integrated circuit with reduced timing overhead and reduced component overhead as compared to at-speed testing techniques used in connection with core wrapper cells. Furthermore, some implementations described herein provide enhanced test coverage and/or reduced test pattern count as compared to at-speed testing techniques used in connection with core wrapper cells. Some implementations described herein can be used for tests at a core level and tests at a chip level (e.g., a chip or SoC that includes multiple cores), including to test cores and an SoC when the SoC includes a large number of cores, as well as cores within cores.

FIG. 1 is a diagram of a scan flip-flop 100. Two representations of a scan flip-flop are illustrated, shown as a first representation 105 and a second representation 110. Furthermore, a test-dedicated scan flip-flop 115 and a shared scan flip-flop 120 are shown.

The scan flip-flop 100 includes a multiplexer 125 and a flip-flop 130. The flip-flop 130 may be a D-type flip-flop (sometimes called a D flip-flop, a data flip-flop, or a delay flip-flop), such as a master-slave edge-triggered D-type flip-flop in which two gated D latches are connected in series (e.g., with an inverted enable signal being input to the second latch in the series when an enable signal is input to the first latch in the series). Thus, in some implementations, the scan flip-flop 100 is a multiplexed input master-slave edge-triggered D-type flip-flop.

The multiplexer 125 is configured to receive two input signals, shown as a data (D) signal and a scan input (SI) signal, sometimes called a "scan-in" signal or a test stimulus input signal. The D signal represents functional data, such as data received from a node (e.g., logic or a circuit) of an integrated circuit that includes the scan flip-flop 100. The SI signal represents test data, such as data received from a testing component to be used to test the node and/or the integrated circuit. The multiplexer 125 is also configured to receive a control signal, shown as a scan enable (SE) signal. The output of the multiplexer 125 is controlled by the SE signal. In a functional mode, the SE signal may be set to low (0), and the multiplexer 125 may pass the D signal (e.g., functional data) to the flip-flop 130. In a test mode, the SE signal may be set to high (1), and the multiplexer 125 may pass the SI signal (e.g., test data) to the flip-flop 130.

The flip-flop 130 is configured to receive an input signal via the multiplexer 125 (e.g., either D or SI). The flip-flop 130 is also configured to receive a clock (CLK) signal that controls latching of the input signal and that controls output of an output signal (Q). For example, when the CLK signal is a first value (e.g., low or 0) or transitions to the first value, the input signal (D or SI) may propagate to a master latch of the flip-flop 130 while a slave latch of the flip-flop 130 retains a previous value stored in the slave latch during the previous clock cycle. The master latch may store the input value and the slave latch may store the previous value while the CLK signal remains at the first value (e.g., low). When the CLK signal transitions to a second value (e.g., high or 1), the value stored in the master latch (D or SI) propagates to the slave latch and to the output Q of the scan flip-flop 100. In some implementations, the flip-flop 130 may include other inputs that are not shown, such as a set input and/or a reset input.

As further shown in FIG. 1, a test-dedicated scan flip-flop 115 may include a scan flip-flop 100 and a test mode multiplexer 135. The test mode multiplexer 135 is configured to receive two input signals, shown as an output Q signal from the scan flip-flop 100 and a data input (DI) signal. The output Q signal may also be provided to a testing component as a scan out (SO) signal. The DI signal may be received from an input pin or a logic component of the integrated circuit. The test mode multiplexer 135 is also configured to receive a control signal, shown as a test enable (TE) signal, which may be an internal test mode enable signal or an external test mode enable signal. The output of the test mode multiplexer 135, shown as a data output (DO) signal, is controlled by the TE signal and may be provided to a logic component or an output pin of an integrated circuit. The DO signal may also be provided back to an input (e.g., the D input) of the test-dedicated scan flip-flop 115. In a functional mode, the TE signal may be set to low (0), and the test mode multiplexer 135 may output the DI signal (e.g., functional data) as the DO signal. In a test mode, the TE signal may be set to high (1), and the test mode multiplexer 135 may output the Q signal as the DO signal. In some implementations, feedback logic 140 (shown as FL) may be present before the D input of the scan flip-flop 100. The feedback logic 140 may be configured to enable a programmable hold of a signal, to enable inversion of a signal, or to enable holding of a signal.

As further shown in FIG. 1, a shared scan flip-flop 120 may include a scan flip-flop 100, an OR gate 145, and a scan-in multiplexer 150. The OR gate 145 is configured to receive a TE signal and an SE signal, as described above. If either the TE signal or the SE signal is set to high (or if both the TE signal and the SE signal is set to high), then the OR gate 145 may pass a high (1) signal to the SE input of the scan flip-flop 100. If both the TE signal and the SE signal are low (0), then the OR gate 145 may pass a low (0) signal to the SE input of the scan flip-flop 100. The scan-in multiplexer 150 may receive an SI signal and a feedback signal (from the Q output of the scan flip-flop 100). As shown, the SE signal may control the scan-in multiplexer 150. If the SE signal is set to high (1), then the scan-in multiplexer 150 may pass the SI signal to the SI input of the scan flip-flop 100. If the SE signal is set to low (0), then the scan-in multiplexer may pass the feedback signal to the SI input of the scan flip-flop 100. In some implementations, feedback logic 155 (shown as FL) may be present before the SI input of the scan flip-flop 100. The feedback logic 155 may be configured to enable a programmable hold of a signal, to enable inversion of a signal, or to enable holding of a signal.

In the test mode, multiple scan flip-flops 100 (which may include test-dedicated scan flip-flops 115 and/or shared scan flip-flops 120) may be connected to form a serial shift register, also known as a scan chain. The scan flip-flops 100 in the scan chain may be loaded with test data (e.g., applied via the SI signal path) using multiple clock pulses. Details of scan chains are described below in connection with FIG. 2.

As indicated above, FIG. 1 is provided as an example. Other examples may differ from what is described with regard to FIG. 1.

Figure 2:
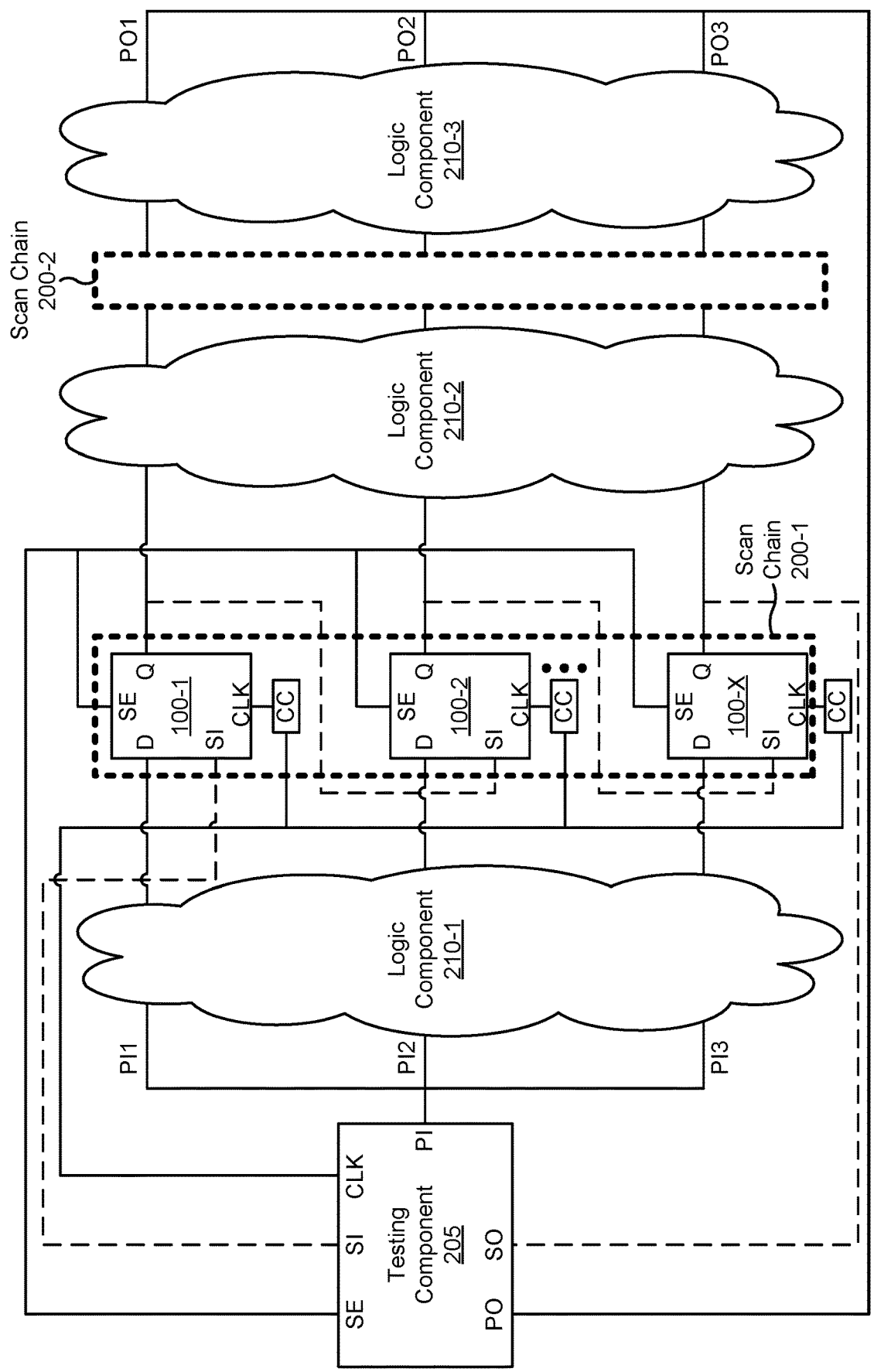
FIG. 2 is a diagram of an example scan chain included in an integrated circuit.

FIG. 2 is a diagram of an example scan chain 200 included in an integrated circuit, shown as a first scan chain 200-1 and a second scan chain 200-2. As shown in FIG. 2, a scan chain 200 includes a series of scan flip-flops 100, shown as scan flip flops 100-1, 100-2, through 100-X (where X≥2) for the first scan chain 200-1. The scan flip-flops 100 are connected in series such that an output Q of each scan flip-flop 100 is connected to the SI input of the next flip-flop 100 in the scan chain 200. The output Q of the final scan flip-flop 100 in the scan chain 200 (shown as scan flip-flop 100-X for the first scan chain 200-1) is connected to a testing component 205 that reads the output as a series of scan out (SO) signals and compares the output to an expected result to determine whether nodes of the integrated circuit are operating properly. In some implementations, the testing component 205 is included in the integrated circuit. Alternatively, the testing component 205 may be automated test equipment that is separate from the integrated circuit and that is connected to input and output pins of the integrated circuit to perform one or more tests.

In a test mode, the testing component 205 loads test data into an initial scan flip-flop 100 included in the scan chain 200, shown as scan flip-flop 100-1 for the first scan chain 200-1. For example, the testing component 205 may transmit an SI signal to the initial scan flip-flop 100-1 while the testing component 205 has the SE signal set to high (1). In some implementations, the testing component 205 sets the CLK signal to low, which causes the SI signal to be locked in a master latch of the initial scan flip-flop 100-1. The testing component 205 may then transition the CLK signal to high, which causes the SI signal to propagate from the master latch to a slave latch of the initial scan flip-flop 100-1 and to be output from the initial scan flip-flop 100-1 as a Q signal. That Q signal propagates to the next scan flip-flop 100-2 as an SI signal input to that scan flip flop 100-2. When the testing component 205 transitions the CLK signal back to low, that SI signal propagates to the master latch of the scan flip-flop 100-2, and a new SI signal transmitted by the testing component 205 can be stored in the master latch of the initial scan flip-flop 100-1. By pulsing the CLK signal in this manner (e.g., transitioning the CLK signal from low to high and then from high to low), test data can be propagated throughout the entire scan chain 200.

As shown, all of the scan flip-flops 100 in the scan chain 200 may be controlled by the same CLK signal (e.g., may be connected to the same clock line or clock bus). In some implementations, the CLK signal is connected through a chopper circuit (sometimes called a clock chopper, and shown as "CC") that overrides a functional clock with a scan clock, as shown in FIG. 2. The scan clock may operate at a low clock frequency for shifting inputs into a scan chain 200, may operate at a low clock frequency (e.g., a low scan clock frequency) for stuck-at test mode capture, and may operate at a high clock frequency (e.g., a high functional clock frequency) for at-speed test mode capture. As further shown, all of the scan flip-flops 100 in the scan chain 200 may be controlled by the same SE signal (e.g., may be connected to the same SE line or SE bus). In some implementations, the testing component 205 controls the SE signal and/or the CLK signal. Alternatively, the SE signal and/or the CLK signal may be controlled by a clock component, a timer component, or another component that operates in tandem with the testing component 205 to load the test data into the scan chain 200.

As further shown in FIG. 2, the integrated circuit may include one or more logic components 210, shown as a first logic component 210-1, a second logic component 210-2, and a third logic component 210-3. A logic component 210 may include any logic (sometimes called combinatorial logic or functional logic) of the integrated circuit that is used to perform one or more functions of the integrated circuit. For example, the logic component 210 may include one or more circuits, one or more elements of one or more circuits, or a combination of multiple circuits. For example, the first logic component 210-1 may perform one or more functions on one or more values input to the first logic component 210-1, and may provide the output (e.g., the result) of performing those one or more functions as D inputs to the scan flip-flops 100 included in the first scan chain 200-1. During the functional mode, the SE signal is set to low, which causes the scan flip flops 100 to select the D input and output that D input as Q output (e.g., based on pulsing of the CLK signal). That Q output is provided as input to the second logic component 210-2, which operates on that input in a similar manner as described in connection with the first logic component 210-1, and so on. The testing component 205 may control the primary inputs (shown as PI1, PI2, and PI3 as examples) to the first logic component 210-1, and may receive the primary outputs (shown as PO1, PO2, and PO3 as examples) from the last logic component 210 included in the test (e.g., the third logic component 210-3 in FIG. 2). In FIG. 2, the primary input (PI) port shown on the testing component 205 may include multiple input ports, such as one for each primary input to be provided to the logic component 210-1. Similarly, the primary output (PO) port shown on the testing component 205 may include multiple output ports, such as one for each primary output received from the third logic component 210-3.

In a test mode, the testing component 205 can test an individual logic component 210 or a series of logic components 210. For example, the testing component 205 may test the second logic component 210-2 by loading test data (e.g., using the SI signal) into the first scan chain 200-1 with the SE signal set to high. A scan chain that is loaded with test data (e.g., a test pattern) may be called a launching scan chain. After the test data is loaded into the scan chain, the testing component 205 may pulse the clock to transmit the test data as Q output to the second logic component 210-2. The second logic component 210-2 may operate on the test data to generate an output, and may provide that output as D inputs to the scan flip-flops included in the second scan chain 200-2. The testing component 205 may set the SE signal of the second scan chain 200-2 to low so that the D inputs are stored by the scan flip-flops 100 included in the second scan chain 200-2. The testing component 205 may then set the SE signal to high and pulse the clock multiple times to obtain the values stored in the scan flip-flops 100 of the second scan chain 200-2 (e.g., as consecutive SO signals). The testing component may compare output represented by the SO signals and/or the primary output signals to an expected result to determine whether the logic component 210-2 is operating properly.

As indicated above, FIG. 2 is provided as an example. Other examples may differ from what is described with regard to FIG. 2.

Figure 3:
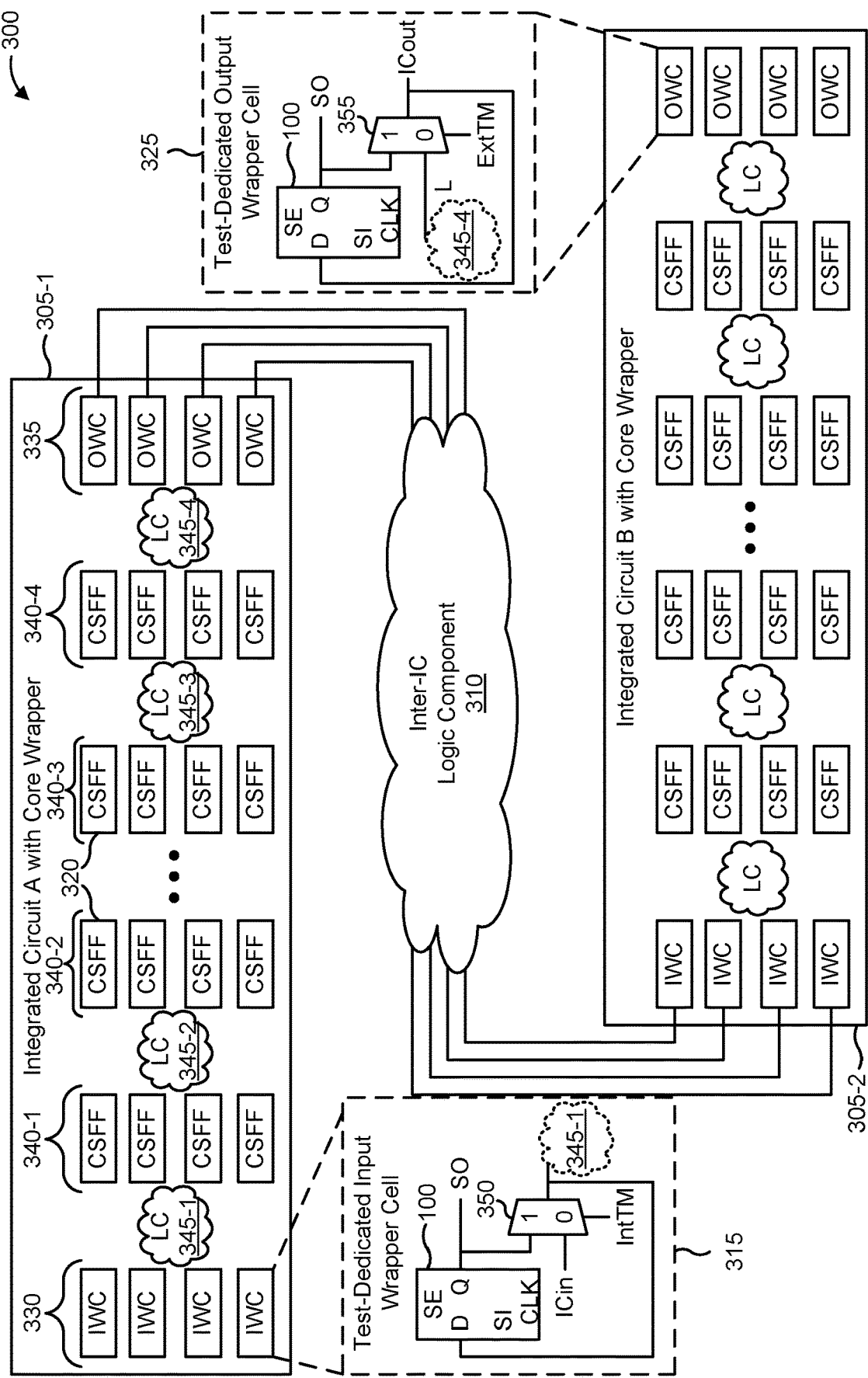
FIG. 3 is a diagram of an example core wrapper architecture for scan testing.

FIG. 3 is a diagram of an example core wrapper architecture 300 for scan testing. As shown in FIG. 3, a system may include multiple integrated circuits 305, shown as a first integrated circuit (IC) 305-1 and a second IC 305-2. The system may also include a logic component 310 (e.g., which may include one or more logic components) situated between ICs 305, such as between the first IC 305-1 and the second IC 305-2. For example, an output of the first IC 305-1 may be passed as an input to the logic component 310. The logic component 310 may perform one or more functions on that input (e.g., as described above in connection with logic component 210 of FIG. 2). The logic component 310 may provide an output of performing the one or more functions as input to the second IC 305-2.

As shown in FIG. 3, to facilitate testing of an IC 305 and/or an interface between ICs 305, the IC 305 may include multiple input wrapper cells 315 (shown as IWC), multiple core scan flip-flops 320 (shown as CSFF), and multiple output wrapper cells 325 (shown as OWC). The input wrapper cells may be arranged in an input cell scan chain 330, represented by a column of input wrapper cells 315 in FIG. 3. Each input wrapper cell 315 may connect to a corresponding input of the IC 305, such as an input pin, an input pad, an input interface, an input bus, or another type of input component. Similarly, the output wrapper cells may be arranged in an output cell scan chain 335, represented by a column of output wrapper cells 325 in FIG. 3. Each output wrapper cell 325 may connect to a corresponding output of the IC 305, such as an output pin, an output pad, an output interface, an output bus, or another type of output component. The core scan flip-flops 320 may be arranged in multiple core scan chains 340 (shown as core scan chain 340-1, core scan chain 340-2, core scan chain 340-3, and core scan chain 340-4), with each core scan chain 340 being represented by a column of core scan flip-flops 320 in FIG. 3. The IC 305 may also include logic components 345 (shown as LC), shown as LC 345-1, LC 345-2, LC 345-3, and LC 345-4. A logic component 345 may include components of the logic component 210 described above in connection with FIG. 2. In some cases, a logic component 310 between ICs 305 may be called an inter-IC logic component, and a logic component 345 within an IC 305 may be called an intra-IC logic component.

In some cases, all of the input wrapper cells 315 included in an IC 305 are included in a single input cell scan chain 330. A logic component 345 may be situated between the input cell scan chain 330 and an initial core scan chain 340-1, similar to the structure described above in connection with FIG. 2. For example, the input cell scan chain 330 may be the first scan chain 200-1 of FIG. 2 (except that the input wrapper cells 315 may have a different configuration than the scan flip-flops 100, as described in more detail below), the initial core scan chain 340-1 may be the second scan chain 200-2 of FIG. 2, and the logic component 345-1 may be the logic component 210-2 of FIG. 2.

Similarly, in some cases, all of the output wrapper cells 325 included in an IC 305 are included in a single output cell scan chain 335. A logic component 345 may be situated between the output cell scan chain 335 and a final core scan chain 340-4, similar to the structure described above in connection with FIG. 2. For example, the final core scan chain 340-4 may be the first scan chain 200-1 of FIG. 2, the output cell scan chain 335 may be the second scan chain 200-2 of FIG. 2 (except that the output wrapper cells 325 may have a different configuration than the scan flip-flops 100, as described in more detail below), and the logic component 345-4 may be the logic component 210-2 of FIG. 2.

As further shown in FIG. 3, a logic component 345 may be situated between consecutive core scan chains 340, similar to the structure described above in connection with FIG. 2. For example, the core scan chain 340-1 may be the first scan chain 200-1 of FIG. 2, the core scan chain 340-2 may be the second scan chain 200-2 of FIG. 2, and the logic component 345-2 may be the logic component 210-2 of FIG. 2. Additional adjacent pairs of core scan chains 340 may be configured in the same way.

An input wrapper cell 315 is an example of a test-dedicated scan flip-flop 115 described above in connection with FIG. 1. For example, as shown in FIG. 3, an input wrapper cell 315 may include a scan flip-flop 100 and an internal test mode multiplexer 350. The internal test mode multiplexer 350 is configured to receive two input signals, shown as an output Q signal from the scan flip-flop 100 and an integrated circuit input (ICin) signal. The ICin signal may be received from an input of the IC 305, such as an input pin or the like. The internal test mode multiplexer 350 is also configured to receive a control signal, shown as an internal test mode (IntTM) signal. The output of the internal test mode multiplexer 350 is controlled by the IntTM signal, and the output of the internal test mode multiplexer 350 is provided to a logic component 345 as well as back to an input (e.g., the D input) of the scan flip-flop 100. In a functional mode, the IntTM signal may be set to low (0), and the internal test mode multiplexer 350 may pass the ICin signal (e.g., functional data) to a logic component 345 of the IC 305 (e.g., logic component 345-1 between the input cell scan chain 330 and the initial core scan chain 340-1). In a test mode, the IntTM signal may be set to high (1), and the internal test mode multiplexer 350 may pass the Q signal to the logic component 345.

An output wrapper cell 325 is another example of a test-dedicated scan flip-flop 115 described above in connection with FIG. 1. For example, as shown in FIG. 3, an output wrapper cell 325 may include a scan flip-flop 100 and an external test mode multiplexer 355. The external test mode multiplexer 355 is configured to receive two input signals, shown as an output Q signal from the scan flip-flop 100 and a data signal L from a logic component 345 of the IC 305. The external test mode multiplexer 355 is also configured to receive a control signal, shown as an external test mode (ExtTM) signal. The output of the external test mode multiplexer 355 is controlled by the ExtTM signal, and the output of the external test mode multiplexer 355 is provided to an output of the IC 305 (e.g., an output pin or the like), shown as ICout, as well as back to an input (e.g., the D input) of the scan flip-flop 100. In a functional mode, the ExtTM signal may be set to low (0), and the external test mode multiplexer 355 may pass the data signal L from a logic component 345 of the IC 305 (e.g., logic component 345-4 between the final core scan chain 340-4 and the output cell scan chain 355) to ICout. In a test mode, the ExtTM signal may be set to high (1), and the external test mode multiplexer 355 may pass the Q signal to ICout.

Using the core wrapper architecture 300, an internal test of logic components 345 within an IC 305 may be performed by loading test data into the single input cell scan chain 330 of the IC 305, setting the IntTM signal to high (1), and pulsing a clock signal one or more times. The test data may be input to and operated on by one or more logic components 345 of the IC 305 and one or more core scan chains 340 of the IC 305. In some implementations, test output is captured by the single output cell scan chain 335, the single input cell scan chain 330, and/or the core scan chains 340 of the IC 305 and provided to a testing component for comparison with an expected test result. For an internal test using the core wrapper architecture 300, the SE signal for an input shared wrapper cell (e.g., capable of being toggled between a test mode and a functional mode) is set to low for a loopback mode in which the Q output from the input shared wrapper cell is inverted and provided back as input to the D input of the input shared wrapper cell. The data on the input shared wrapper cell is inverted at a high functional clock frequency for an at-speed test mode or at a low scan clock frequency for a stuck-at test mode. The SE signal for an input shared wrapper cell is set to high for a non-loopback mode (e.g., in which the Q output is not inverted and provided as input to the input to the SI input of the next shared wrapper cell). In either case, the SE signal for an output shared wrapper cell (e.g., capable of being toggled between a test mode and a functional mode) is set to low to capture data along the D path.

Using the core wrapper architecture 300, an external test of logic component 310 between ICs 305 may be performed by loading test data into the single output cell scan chain 335 of the first IC 305-1, setting the ExtTM signal to high (1), and pulsing a clock signal one or more times. The test data may be input to and operated on by the logic component 310. The test output may be captured by the single input cell scan chain 330 of the second IC 305-2 and provided to a testing component for comparison with an expected test result. For an external test using the core wrapper architecture 300, the SE signal for an output shared wrapper cell is set to low for a loopback mode in which the Q output from the output shared wrapper cell is inverted and provided back as D input of the output shared wrapper cell. The data on the output shared wrapper cell is inverted at a high functional clock frequency for an at-speed test mode or at a low scan clock frequency for a stuck-at test mode. The SE signal for an output shared wrapper cell is set to high for a non-loopback mode (e.g., in which the Q output is not inverted and provided as SI input to the next shared wrapper cell). In either case, the SE signal for an input shared wrapper cell is set to low to capture data along the D path.

Using the core wrapper architecture 300 can result in various inefficiencies when testing an IC 305 or an inter-IC logic component 310 situated between ICs 305. For example, a slow clock frequency (e.g., slower than a functional clock frequency, also called an at-speed clock frequency) may be used to load test data into a launching scan chain (e.g., using pulses at the slow clock frequency to propagate test data throughout the scan chain), such as an input cell scan chain 330 or an output cell scan chain 335, while the SE signal is set to high (1) for the launching scan chain. For example, the slow clock frequency may be 100 megahertz (MHz) or less (e.g., 25 MHz, 50 MHz, 75 MHz, or 100 MHz), and the functional clock frequency may be 600 MHz or more (e.g., 600 MHz or 800 MHz). The slow clock frequency (e.g., a slow clock pulse) may also be used to output that test data to a logic component after the scan chain is loaded, sometimes called scan shifting. The SE signal is set to low (0) for the core scan chains 340 and the output cell scan chain 335 to enable the core scan chains 340 and the output cell scan chain 335 to capture data output from the logic component after the logic component operates on the test data. This requires two different SE signals, one for the launching scan chain (e.g., to set SE to high to trigger the launch) and one for the core scan chains 340 and the output cell scan chain 335 (e.g., to set SE to low to capture the test results), which increases system complexity.

Using the core wrapper architecture 300, when a launching scan chain uses a non-loopback mode (e.g., in which the Q output is not inverted and provided as SI input to the next wrapper cell of the launching scan chain), the slow clock frequency is used to load (or shift) test data in into the launching scan chain, but during capture as the SE signal is high, the shifting happens at a high functional clock frequency for an at-speed test, resulting in timing overhead.

One technique for overcoming this limitation includes using inverted loopback shared wrapper cells. The slow scan clock frequency may then be used to shift the Q signal at a first wrapper flop to the SI signal at a second wrapper flop. The high functional clock frequency or the slow scan clock frequency may be used during capture, which provides inverted data every capture cycle for performing an at-speed test (using the high functional clock frequency) or a stuck-at test (using the slow scan clock frequency). This enables execution of an at-speed test at the functional clock frequency or a stuck-at test using the slow clock frequency. However, this requires additional components (e.g., a multiplexer to select the inverted Q value to be fed back to the scan flip-flop 100 during the test mode). Furthermore, inverting a test pattern can be problematic if particular test data needs to be tested, but the test is instead executed on inverted data. This can lead to loss of test coverage. Furthermore, extra test patterns may be needed to ensure appropriate coverage when inverted Q values are used, thus leading to pattern count inflation.

Additionally, the use of test-dedicated wrapper cells in the core wrapper architecture requires the use of the internal test mode multiplexer 350 and the external test mode multiplexer 355, which may add to the complexity of the system as compared to using a shared scan flip-flop that is capable of being using in both the functional mode and the test mode. A test-dedicated wrapper cell may also be incapable of operating at a functional clock frequency because a test-dedicated wrapper cell is not part of a functional chain of components. Some implementations described herein enable at-speed core and interface testing of an integrated circuit while avoiding the issues described above.

As indicated above, FIG. 3 is provided as an example. Other examples may differ from what is described with regard to FIG. 3.

Figure 4:
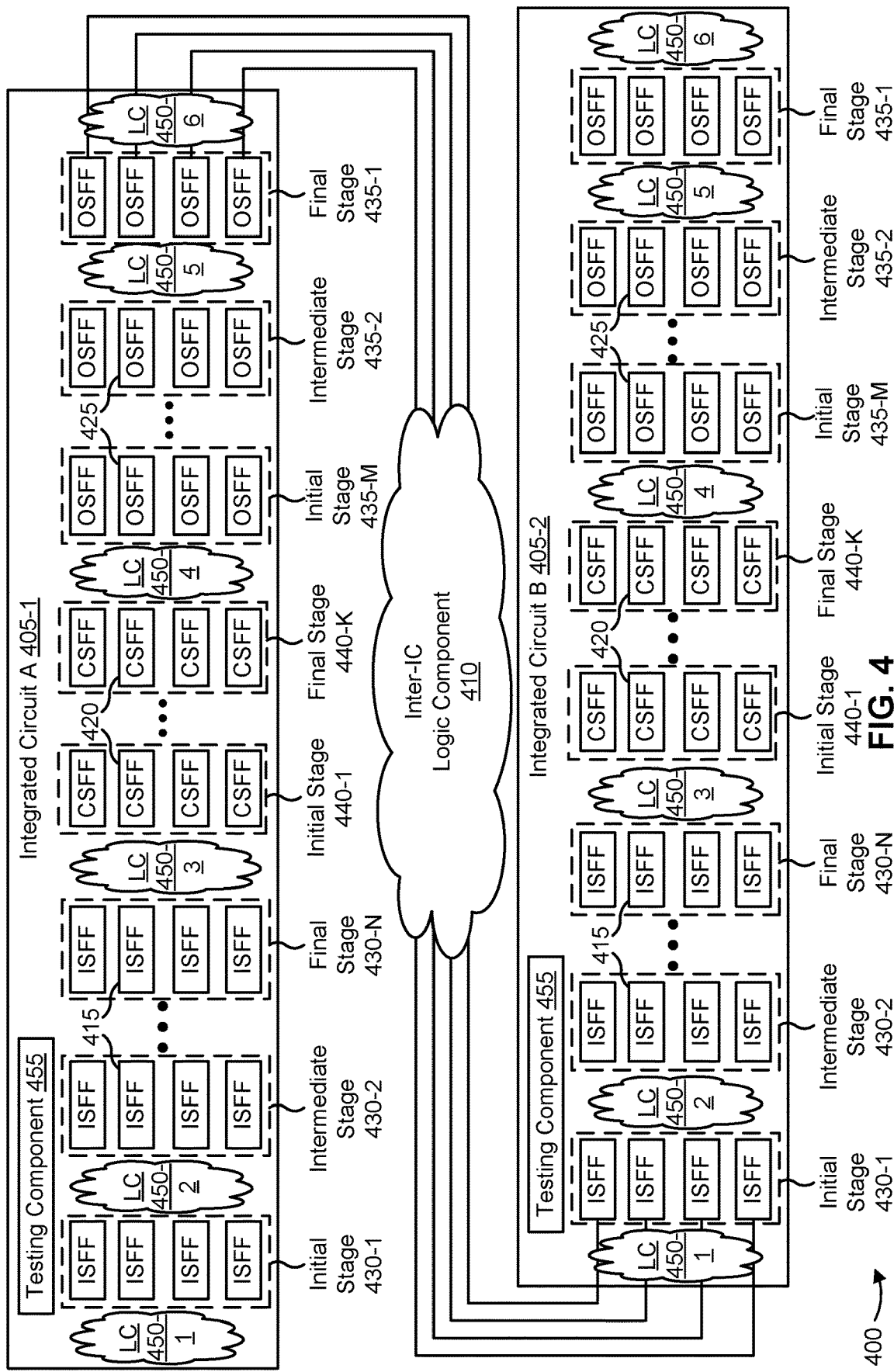
FIG. 4 is a diagram of an example architecture that includes multiple input scan flip-flop stages and multiple output scan flip-flop stages for scan testing.

FIG. 4 is a diagram of an example architecture 400 that includes multiple input scan flip-flop stages and multiple output scan flip-flop stages for scan testing. As shown in FIG. 4, a system may include multiple integrated circuits 405, shown as a first IC 405-1 and a second IC 405-2. In some implementations, an IC 405 may be a core, a hard macro, or another type of IC included in an SoC. The system may also include a logic component 410 (e.g., which may include one or more logic components) situated between ICs 405, such as between the first IC 405-1 and the second IC 405-2. For example, an output of the first IC 405-1 may be passed as an input to the logic component 410. The logic component 410 may perform one or more functions on that input (e.g., as described above in connection with logic component 210 of FIG. 2). The logic component 410 may provide an output of performing the one or more functions as input to the second IC 405-2.

As shown in FIG. 4, to facilitate testing of an IC 405 and/or an interface between ICs 405, the IC 405 may include multiple input scan flip-flops 415 (shown as ISFF), multiple core scan flip-flops 420 (shown as CSFF), and multiple output scan flip-flops 425 (shown as OSFF). As shown, the ISFFs 415 may be arranged or configured in multiple stages, sometimes called ISFF stages 430. Similarly, the OSFFs 425 may be arranged or configured in multiple stages, sometimes called OSFF stages 435. In some implementations, the CSFFs 420 are arranged or configured in multiple stages, sometimes called CSFF stages 440. Each stage may include a separate scan chain from the other stages. In other words, the ISFFs 415 included in the IC 405 may be arranged or configured to form multiple scan chains, sometimes called ISFF scan chains. Similarly, the OSFFs 425 included in the IC 405 may be arranged or configured to form multiple scan chains, sometimes called OSFF scan chains. In some implementations, the CSFFs 420 included in the IC 405 may be arranged or configured to form multiple scan chains, sometimes called CSFF scan chains. Each stage or scan chain is represented by a column of scan flip-flops in FIG. 4. The IC 405 may also include a logic component 450 before an initial ISFF stage 430-1, after a final OSFF stage 435-1, and between each scan chain (e.g., each stage) included in the IC 405, such as the logic component 210 described above in connection with FIG. 2. In some cases, a logic component 410 between ICs 405 may be called an inter-IC logic component, and a logic component 450 within an IC 405 may be called an intra-IC logic component. In some implementations, the IC 405 includes an IC-level testing component 455, which may be configured to perform a scan test, a chain test, a built-in self-test (BIST) (e.g., a logic BIST), an embedded deterministic test (EDT), and/or a compression/decompression (CODEC) test.

In some implementations, the ISFFs 415, the CSFFs 420, and the OSFFs 425 of an integrated circuit 405 are accessible to the IC-level testing component 455 of that integrated circuit 405 (e.g., the IC-level testing component 455 of an IC 405 is configured to load and/or is capable of loading test data into the ISFFs 415, the CSFFs 420, and the OSFFs 425 of the IC 405). The IC-level testing component 455 of an integrated circuit 405 may be configured to perform a core test of that integrated circuit 405. In some implementations, the ISFFs 415 and the OSFFs 425 of each integrated circuit 405 are accessible to a system-level testing component of a system (e.g., the system-level testing component is configured to load and/or is capable of loading test data into the ISFFs 415 and/or the OSFFs 425 of multiple integrated circuits 405, such as each integrated circuit 405 included in the system), and the CSFFs 420 are not accessible to the system-level testing component (e.g., the system-level testing component is not configured to load and/or is not capable of loading test data into the CSFFs 420 of any of the integrated circuits 405). The system-level testing component may be external from the ICs 405 that include the ISFFs 415 and the OSFFs 425 (e.g., that are accessible to the system-level testing component) and that include the CSFFs 420 (e.g., that are not accessible to the system-level testing component). In other words, the system-level testing component may be external from all of the individual ICs 405 being tested (e.g., all of the ICs 405 that include ISFFs 415 and/or OSFFs 425 to be loaded with test data and/or from which a test result is to be captured). In some implementations, the system-level testing component is the system-level testing component 555 described below in connection with FIG. 5. The system-level testing component 555 (e.g., an interface testing component of the system-level testing component 555) may be configured to perform an interface test to test an interface between two ICs 405, in which case the system-level testing component 555 accesses ISFFs 415 and OSFFs 425 of ICs 405 (but not CSFFs 420 of ICs 405). Additionally, or alternatively, the system-level testing component 555 (e.g., a core testing component of the system-level testing component 555) may be configured to perform a core test to test core scan flip-flops at the system level (e.g., between ICs 405 and/or between ICs 505), in which case the system-level testing component 555 does not access any ISFFs 415, CSFFs 420, or OSFFs 425 of ICs 405 and/or of ICs 505. As described in more detail below in connection with FIG. 5, a core test may be performed by loading test data into system-level input scan flip-flops, system-level core scan flip-flops, and system-level output scan flip-flops, executing the test, and observing test results. Additional details of the system-level testing component are described below in connection with FIG. 5.

As an example, the ISFFs 415 may be arranged in an initial ISFF stage 430-1, one or more intermediate ISFF stages 430-2, and a final ISFF stage 430-N. In some implementations, the ISFFs 415 are part of an ISFF scan chain and are accessible to a testing component by different ISFF scan in signals and/or scan out signals. Thus, the ISFFs 415 are not necessarily separated into different scan chains based on the logic components 450 situated in between ISFF stages. Thus, in some implementations, all of the ISFFs 415 (e.g., all of the ISFF stages) are part of a single ISFF scan chain. However, in some implementations, the ISFFs 415 may be formed into multiple ISFF scan chains, which may or may not correspond to the ISFF stages. In some implementations, each of the ISFFs 415 included in the initial ISFF stage 430-1 (e.g., each ISFF 415 included in an initial ISFF scan chain) may be configured to receive input from a corresponding input component of the IC 405 (e.g., via a logic component 450, such as logic component 450-1), such as an input pin, an input pad, an input interface, an input bus, or another type of input component. For example, each D input in the initial ISFF scan chain receive input from a corresponding input component of the IC 405 (e.g., via a logic component, such as logic component 450-1).

In some implementations, each of the ISFFs 415 included in the final ISFF stage 430-N (e.g., each ISFF 415 included in a final ISFF scan chain) may be configured to provide output to a logic component 450 that provides output to a CSFF stage (e.g., an initial CSFF stage 440-1), such as logic component 450-3. For example, each Q output in the final ISFF scan chain may be connected to the logic component 450-3 having outputs connected to an initial CSFF scan chain (e.g., connected to D inputs of the initial CSFF scan chain).

In some implementations, each of the ISFFs 415 included in an intermediate ISFF stage 430-2 (e.g., each ISFF 415 included in an intermediate ISFF scan chain) may be configured to receive input from a logic component 450 that receives input from another ISFF stage (e.g., the initial ISFF stage 430-1 or another intermediate ISFF stage 430-2) and may be configured to provide output to a logic component 450 that provides output to another ISFF stage (e.g., the final ISFF stage 430-N or another intermediate ISFF stage 430-2). For example, each D input in an intermediate ISFF scan chain may be connected to a logic component 450 having inputs connected to Q outputs of a preceding ISFF scan chain (e.g., an initial ISFF scan chain or another intermediate ISFF scan chain), and each Q output in the intermediate ISFF scan chain may be connected to a logic component 450 having outputs connected to D inputs of a subsequent ISFF scan chain (e.g., a final ISFF scan chain or another intermediate ISFF scan chain).

In some implementations, the IC 405 does not include any intermediate ISFF stages 430-2. For example, the IC 405 may include only two ISFF stages (e.g., N=2), such as a first ISFF stage that is the initial ISFF stage 430-1 and a second ISFF stage that is the final ISFF stage 430-N. In this case, each of the ISFFs 415 included in the initial ISFF stage 430-1 may be configured to provide output to a logic component 450 that provides output to the final ISFF stage 430-N, and each of the ISFFs 415 included in the final ISFF stage 430-N may be configured to receive input from that same logic component 450, which receives input from the initial ISFF stage 430-1. For example, each Q output in the initial ISFF scan chain may be connected to a logic component 450 having outputs connected to the D inputs of the final ISFF scan chain, and each D input in the final ISFF scan chain may be connected to that same logic component 450 having inputs connected to the Q outputs of the initial ISFF scan chain.

As another example, the OSFFs 425 may be arranged in a final OSFF stage 435-1, one or more intermediate OSFF stages 435-2, and an initial OSFF stage 435-M. In some implementations, the OSFFs 425 are part of an OSFF scan chain and are accessible to a testing component by different OSFF scan in signals and/or scan out signals. Thus, the OSFFs 425 are not necessarily separated into different scan chains based on the logic components 450 situated in between OSFF stages. Thus, in some implementations, all of the OSFFs 425 (e.g., all of the OSFF stages) are part of a single OSFF scan chain. However, in some implementations, the OSFFs 425 may be formed into multiple OSFF scan chains, which may or may not correspond to the OSFF stages. In some implementations, each of the OSFFs 425 included in the final OSFF stage 435-1 (e.g., each OSFF 425 included in a final OSFF scan chain) may be configured to provide output to a corresponding output component of the IC 405 (e.g., via a logic component, such as logic component 450-6), such as an output pin, an output pad, an output interface, an output bus, or another type of output component. For example, each Q output in the final OSFF scan chain may provide output to a corresponding output component of the IC 405 (e.g., via a logic component, such as logic component 450-6).

In some implementations, each of the OSFFs 425 included in the initial OSFF stage 435-M (e.g., each OSFF 425 included in an initial OSFF scan chain) may be configured to receive input from a logic component 450 that receives input from a CSFF stage (e.g., a final CSFF stage 440-K), such as logic component 450-4. For example, each D input in the initial OSFF scan chain may be connected to the logic component 450-4 having inputs connected to a final CSFF scan chain (e.g., connected to Q outputs of the final CSFF scan chain).

In some implementations, each of the OSFFs 425 included in an intermediate OSFF stage 435-2 (e.g., each OSFF 425 included in an intermediate OSFF scan chain) may be configured to receive input from a logic component 450 that receives input from another OSFF stage (e.g., the initial OSFF stage 435-M or another intermediate OSFF stage 435-2) and may be configured to provide output to a logic component 450 that provides output to another OSFF stage (e.g., the final OSFF stage 435-1 or another intermediate OSFF stage 435-2). For example, each D input in an intermediate OSFF scan chain may be connected to a logic component 450 having inputs connected to Q outputs of a preceding OSFF scan chain (e.g., an initial OSFF scan chain or another intermediate OSFF scan chain), and each Q output in the intermediate OSFF scan chain may be connected to a logic component 450 having outputs connected to D inputs of a subsequent OSFF scan chain (e.g., a final OSFF scan chain or another intermediate OSFF scan chain).

In some implementations, the IC 405 does not include any intermediate OSFF stages 435-2. For example, the IC 405 may include only two OSFF stages (e.g., M=2), such as a first OSFF stage that is the final OSFF stage 435-1 and a second OSFF stage that is the initial OSFF stage 435-M. In this case, each of the OSFFs 425 included in the initial OSFF stage 435-M may be configured to provide output to a logic component 450 that provides output to the final OSFF stage 435-1, and each of the OSFFs 425 included in the final OSFF stage 435-1 may be configured to receive input from that same logic component 450, which receives input from the initial OSFF stage 435-M. For example, each Q output in the initial OSFF scan chain may be connected to a logic component 450 having outputs connected to the D inputs of the final OSFF scan chain, and each D input in the final OSFF scan chain may be connected to that same logic component 450 having inputs connected to the Q outputs of the initial OSFF scan chain.

In some implementations, the CSFFs 420 may be arranged in multiple stages, where each stage includes a separate scan chain from the other stages. In some implementations, the CSFFs 420 are part of a CSFF scan chain and are accessible to a testing component by different CSFF scan in signals and/or scan out signals. Thus, the CSFFs 420 are not necessarily separated into different scan chains based on the logic components 450 situated in between CSFF stages. Thus, in some implementations, all of the CSFFs 420 (e.g., all of the CSFF stages) are part of a single CSFF scan chain. However, in some implementations, the CSFFs 420 may be formed into multiple CSFF scan chains, which may or may not correspond to the CSFF stages. For example, the CSFFs 420 may be arranged in an initial CSFF stage 440-1, a final CSFF stage 440-K, and one or more intermediate CSFF stages, which are not shown, but which are situated between the initial CSFF stage 440-1 and the final CSFF stage 440-K (like the core scan chains 340-2 and 340-3 shown in FIG. 3).

In some implementations, each of the CSFFs 420 included in the initial CSFF stage 440-1 (e.g., each CSFF 420 included in an initial CSFF scan chain) may be configured to receive input from a logic component 450 that receives input from an ISFF stage (e.g., the final ISFF stage 430-N), such as logic component 450-3. For example, each D input in the initial CSFF scan chain may be connected to the logic component 450-3 having inputs connected to a final ISFF scan chain (e.g., connected to Q outputs of the final ISFF scan chain).

In some implementations, each of the CSFFs 420 included in the final CSFF stage 440-K (e.g., each CSFF 420 included in a final CSFF scan chain) may be configured to provide output to a logic component 450 that provides output to an OSFF stage (e.g., an initial OSFF stage 435-M), such as logic component 450-4. For example, each Q output in the final CSFF scan chain may be connected to the logic component 450-4 having outputs connected to an initial OSFF scan chain (e.g., connected to D inputs of the initial OSFF scan chain).

In some implementations, each of the CSFFs 420 included in an intermediate CSFF stage (e.g., each CSFF 420 included in an intermediate CSFF scan chain) may be configured to receive input from a logic component 450 that receives input from another CSFF stage (e.g., the initial CSFF stage 440-1 or another intermediate CSFF stage) and may be configured to provide output to a logic component 450 that provides output to another CSFF stage (e.g., the final CSFF stage 440-K or another intermediate CSFF stage). For example, each D input in an intermediate CSFF scan chain may be connected to a logic component 450 having inputs connected to Q outputs of a preceding CSFF scan chain (e.g., an initial CSFF scan chain or another intermediate CSFF scan chain), and each Q output in the intermediate CSFF scan chain may be connected to a logic component 450 having outputs connected to D inputs of a subsequent CSFF scan chain (e.g., a final CSFF scan chain or another intermediate CSFF scan chain).

In some implementations, the IC 405 may include only a single CSFF scan chain, in which case the initial CSFF stage 440-1 is the same as the final CSFF stage 440-K and there are no intermediate CSFF stages. In this case, the single CSFF stage may be considered as an ISFF stage or an OSFF stage without any CSFF stages for the IC 405. However, in practice this is unlikely, and it is more likely that the IC 405 includes a large number of CSFF scan chains, such as the initial CSFF stage 440-1, the final CSFF stage 440-K, and several, tens, hundreds, or thousands of intermediate CSFF stages, depending on the complexity and design of the IC 405.

In some implementations, each of the scan flip-flops included in the IC 405 (e.g., each ISFF 415, each CSFF 420, and each OSFF 425) consist of a scan flip-flop 100 with no other components. For example, in some implementations, the ISFFs 415 of the IC 405 do not include the internal test mode multiplexer 350 described above in connection with FIG. 3. Similarly, in some implementations, the OSFFs 425 of the IC 405 do not include the external test mode multiplexer 355 described above in connection with FIG. 3. This may reduce complexity of the IC 405 compared to the IC 305, and may enable all scan flip-flops of the architecture 400 to operate at the functional clock frequency for an at-speed test. In some implementations, none of the ISFFs 415 are test-dedicated scan flip-flops. In other words, all of the ISFFs 415 may be capable of operating in a functional mode and in a test mode. For example, all, of the ISFFs 415 may be shared scan flip-flops, such as the shared scan flip-flop 120 of FIG. 1. Similarly, in some implementations, none of the OSFFs 425 are test-dedicated scan flip-flops. In other words, all of the OSFFs 425 may be capable of operating in a functional mode and in a test mode. For example, all, of the OSFFs 425 may be shared scan flip-flops, such as the shared scan flip-flop 120 of FIG. 1. This may increase functional test coverage and reduce complexity of the IC 405 as compared to an IC that includes one or more test-dedicated scan flip-flops.

Using the architecture 400, an IC-level testing 455 may be configured to perform an internal test (sometimes called a core test) of logic components 450 within the IC 405 by loading test data into each ISFF stage, each CSFF stage, and each OSFF stage of the IC 405. The IC-level testing component 455 may set the SE signal for all of the ISFF scan chains, all of the CSFF scan chains, and all of the OSFF scan chains to high (1) to load the test data, and may pulse a clock signal multiple times using a slow clock frequency to propagate the test data through the ISFF scan chains, the CSFF scan chains, and the OSFF scan chains. The IC-level testing component 455 may then set the SE signal for all of the ISFF scan chains, all of the CSFF scan chains, and all of the OSFF scan chains to low (0) and pulse a clock signal multiple times using the functional clock frequency to perform an at-speed test of the internal components of the IC 405 (or may pulse the clock signal multiple times using the slow clock frequency for a stuck-at test). A test result captured at the ISFF stages, the CSFF stages, and the OSFF stages may correspond to a test pattern loaded into the ISFF stages, the CSFF stages, and the OSFF stages of the IC 405 (e.g., based on test data loaded into each ISFF stage, each CSFF stage, and each OSFF stage, which may be loaded in parallel across ISFF stages, CSFF stages, and OSFF stages). The IC-level testing component 455 may obtain the test result from the ISFF stages, the CSFF stages, and the OSFF stages of the IC 405 and may compare the test result to a corresponding expected result (e.g., an expected result that corresponds to a test pattern that results in that test result) to determine whether the logic components 450 within the IC 405 are properly functioning.

Using the architecture 400, a system-level testing component (e.g., the system-level testing component 555 of FIG. 5) may be configured to perform an external test (sometimes called an interface test) of a logic component 410 between ICs 405 (e.g., between the first IC 405-1 and the second IC 405-2) by loading test data into each OSFF stage of the first IC 405-1 and each ISFF stage of the second IC 405-2. In some implementations, the system-level testing component 555 includes an interface testing component configured to perform the external test or the interface test. In some implementations, the ISFFs 415 and the OSFFs 425 are accessible to the interface testing component, and the CSFFs 420 are not accessible to the interface testing component. The system-level testing component 555 may set the SE signal for all of the OSFF scan chains and all of the ISFF scan chains to high (1) to load the test data, and may pulse a clock signal multiple times using a slow clock frequency to propagate the test data through the OSFF scan chains and the ISFF scan chains. The system-level testing component 555 may then set the SE signal for all of the OSFF scan chains and all of the ISFF scan chains to low (0) and pulse a clock signal multiple times using the functional clock frequency to perform an at-speed test of the logic component 410 between ICs 405 (or may pulse the clock signal multiple times using the slow clock frequency for a stuck-at test). A test result captured at the OSFF stages of the first IC 405-1 and the ISFF stages of the second IC 405-2 may correspond to a test pattern loaded into the OSFF stages of the first IC 405-1 and the ISFF stages of the second IC 405-2 (e.g., based on test data loaded into each OSFF stage and each ISFF stage, which may be loaded in parallel across OSFF stages and ISFF stages). The system-level testing component 555 may obtain the test result from the OSFF stages of the first IC 405-1 and the ISFF stages of the second IC 405-2 and may compare the test result to a corresponding expected result (e.g., an expected result that corresponds to a test pattern that results in that test result) to determine whether the logic component 410 between the first IC 405-1 and the second IC 405-2 is properly functioning.

By using multiple stages of ISFFs and/or OSFFs, an at-speed test with multiple pulses can be performed with launching of test data from the D path to the Q path using the functional clock frequency and scan enable set to low because each ISFF and OSFF is capable of operating in a functional mode and a test mode (as compared to a test-dedicated core wrapper flop, which can only operate in a test mode and thus can only launch test data from an SI path to the Q path using the slow clock frequency and scan enable set to high). This may reduce timing overhead associated with at-speed testing of an IC and/or a system. This may also reduce complexity of the system by enabling transmission of the same SE signal to a launching scan chain and a capture scan chain as compared to the architecture 300 where different SE signals need to be sent to launching scan chains versus capture scan chains. Furthermore, the architecture 400 does not require inverting Q outputs to D inputs of the same shared wrapper cell that operates in an inverted loopback mode, thereby reducing design complexity, improving test coverage, and reducing pattern count inflation. Furthermore, techniques described herein can be used for inter-IC testing, which assists with testing and/or characterizing functional interfaces and avoids the necessity of executing a boundary scan (B SCAN) test at the system level.

As indicated above, FIG. 4 is provided as an example. Other examples may differ from what is described with regard to FIG. 4.

Figure 5:
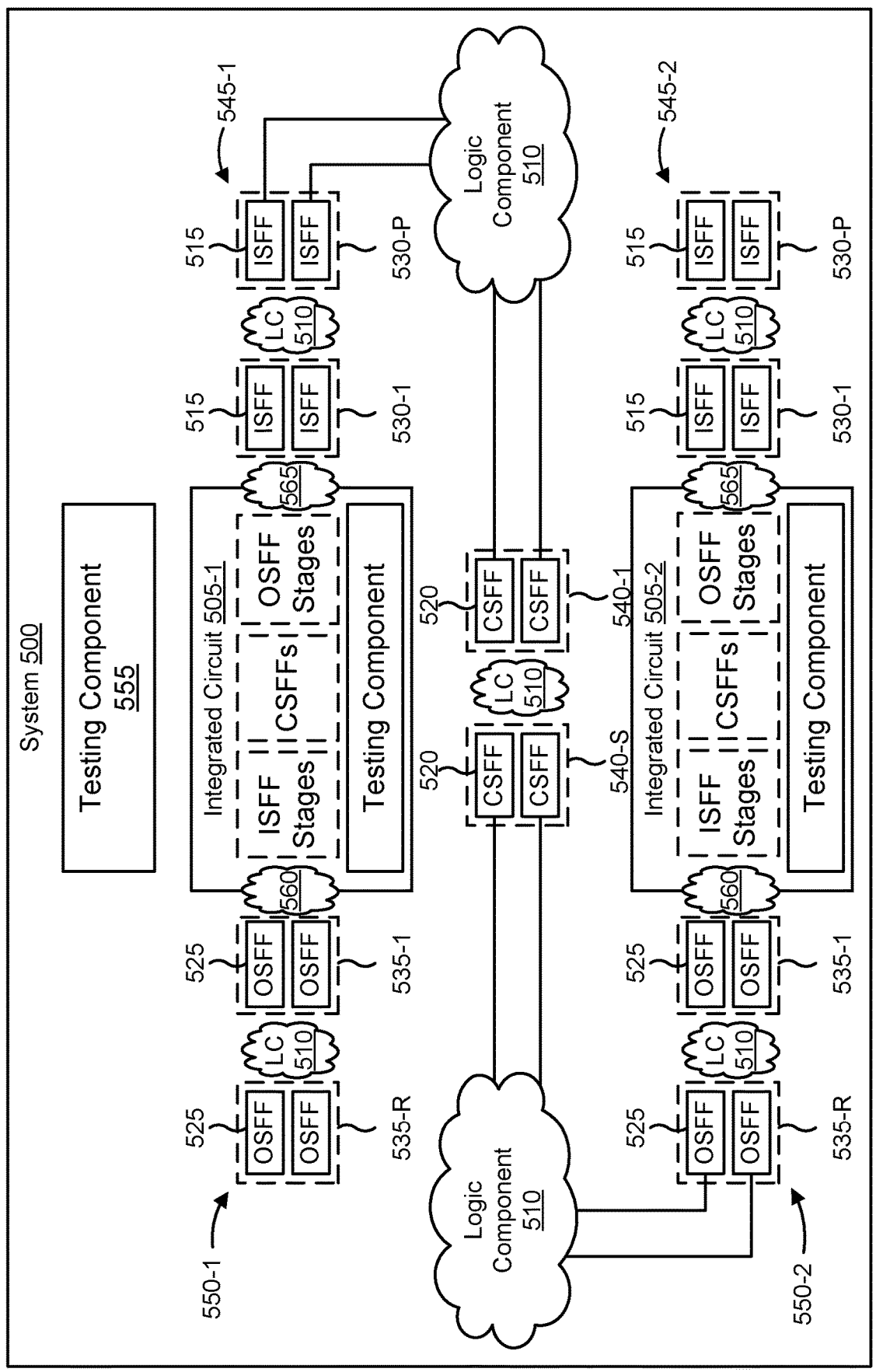
FIG. 5 is a diagram of an example architecture of a system that includes multiple upper-level input scan flip-flop stages and multiple upper-level output scan flip-flop stages for scan testing.

FIG. 5 is a diagram of an example architecture of a system 500 that includes multiple upper-level input scan flip-flop stages and multiple upper-level output scan flip-flop stages for scan testing. As shown in FIG. 5, the system 500 may include multiple integrated circuits 505, shown as a first IC 505-1 and a second IC 505-2. In some implementations, the system 500 may be an SoC, and an IC 505 may be a core, a hard macro, or another type of IC included in the SoC. In some implementations, the IC 505 has the same architecture as the IC 405 described above in connection with FIG. 4. For example, an IC 505 may include multiple ISFF stages 430, multiple OSFF stages 435, multiple core stages 440, and a logic component 450 between consecutive stages, as described above in connection with FIG. 4. In some implementations, an IC 505 may include an IC-level testing component 455, as described above in connection with FIG. 4.

The system 500 may also include one or more logic components 510 situated between ICs 505. A logic component 510 may be called an upper-level logic component or an inter-IC logic component to differentiate from a logic component 450 included within an IC 405, which may be called a lower-level logic component or an intra-IC logic component. A logic component 510 may include any logic of the system 500 that is used to perform one or more functions of the system 500. For example, the logic component 510 may include one or more circuits, one or more elements of one or more circuits, or a combination of multiple circuits, similar to the logic component 210 described above in connection with FIG. 2. A logic component 510 may include combinatorial logic.

As shown in FIG. 5, to facilitate testing of the system 500, ICs 505, and/or an interface between ICs 505, the system 500 may include multiple ISFFs 515, multiple CSFFs 520, and multiple OSFFs 525. To differentiate between scan flip-flops at different levels of the system 500, scan flip-flops within a core or an IC 505 (e.g., ISFFs 415, CSFFs 420, and OSFFs 425) may be called lower-level scan flip-flops, such as lower-level ISFFs 415, lower-level CSFFs 420, and lower-level OSFFs 425. Scan flip-flops outside of a core or an IC 505 (e.g., ISFFs 515, CSFFs 520, and OSFFs 525) may be called upper-level scan flip-flops, such as upper-level ISFFs 515, upper-level CSFFs 520, and upper-level OSFFs 525.

As shown, the ISFFs 515 may be arranged or configured in multiple stages, sometimes called ISFF stages 530. Similarly, the OSFFs 525 may be arranged or configured in multiple stages, sometimes called OSFF stages 535. In some implementations, the CSFFs 520 are arranged or configured in multiple stages, sometimes called CSFF stages 540. In some implementations, the ISFFs 515 are part of an ISFF scan chain and are accessible to a testing component by different ISFF scan in signals and/or scan out signals, the CSFFs 520 are part of a CSFF scan chain and are accessible to a testing component by different CSFF scan in signals and/or scan out signals, and/or the OSFFs 525 are part of an OSFF scan chain and are accessible to a testing component by different OSFF scan in signals and/or scan out signals. Thus, the ISFFs 515, the CSFFs 520, and the OSFFs 525 are not necessarily separated into different scan chains based on the logic components 450 situated in between the ISFF stages 530, the CSFF stages 540, and the OSFF stages 535. Thus, all of ISFFs 515 (e.g., all of the ISFF stages) may be part of a single ISFF scan chain or may be part of multiple ISFF scan chains (which may or may not correspond to the ISFF stages), all of CSFFs 520 (e.g., all of the CSFF stages) may be part of a single CSFF scan chain or may be part of multiple CSFF scan chains (which may or may not correspond to the CSFF stages), and/or all of OSFFs 525 (e.g., all of the OSFF stages) may be part of a single OSFF scan chain or may be part of multiple OSFF scan chains (which may or may not correspond to the OSFF stages). To differentiate between scan flip-flop stages at different levels of the system 500, scan flip-flop stages within a core or an IC 505 (e.g., ISFF stages 430, OSFF stages 435, and CSFF stages 440) may be called lower-level scan flip-flop stages, such as lower-level ISFF stages 430, lower-level OSFF stages 435, and lower-level CSFF stages 440. Scan flip-flop stages outside of a core or an IC 505 (e.g., ISFF stages 530, OSFF stages 535, and CSFF stages 540) may be called upper-level scan flip-flop stages, such as upper-level ISFF stages 530, upper-level OSFF stages 535, and upper-level CSFF stages 540.

Each stage may include a separate scan chain from the other stages. In other words, the ISFFs 515 included in the system 500 may be arranged or configured to form multiple scan chains, sometimes called ISFF scan chains (or upper-level ISFF scan chains to distinguish from the lower-level ISFF scan chains included in an IC 505). Similarly, the OSFFs 525 included in the system 500 may be arranged or configured to form multiple scan chains, sometimes called OSFF scan chains (or upper-level OSFF scan chains to distinguish from the lower-level OSFF scan chains included in an IC 505). In some implementations, the CSFFs 520 included in the system 500 may be arranged or configured to form multiple scan chains, sometimes called CSFF scan chains (or upper-level CSFF scan chains to distinguish from the lower-level CSFF scan chains included in an IC 505). Each stage or scan chain is represented by a column of scan flip-flops in FIG. 5. The system 500 may include a logic component 510 between each scan chain (e.g., each stage) included in the system 500.

As further shown, the ISFFs 515 may be arranged in multiple ISFF groups 545, with each ISFF group 545 being configured to receive an output of a different IC 505 as an input to the initial ISFF stage of that ISFF group 545. Each ISFF group 545 includes multiple ISFF stages 530. Furthermore, each ISFF group 545 is distinct from every other ISFF group 545 (e.g., there are not any ISFFs 515 or ISFF stages 530 included in more than one ISFF group 545).

Similarly, the OSFFS 525 may be arranged in multiple OSFF groups 550, with each OSFF group 550 being configured to provide an output from the final OSFF stage 535 of that OSFF group 550 as an input to a different IC 505. Each OSFF group 550 includes multiple OSFF stages 535. Furthermore, each OSFF group 550 is distinct from every other OSFF group 550 (e.g., there are not any OSFFs 525 or OSFF stages 535 included in more than one OSFF group 550).

As an example, the ISFFs 515 may be arranged in an initial ISFF stage 530-1, one or more intermediate ISFF stages (not shown), and a final ISFF stage 530-P, in a similar manner as described above in connection with FIG. 4 with regard to the lower-level ISFF stages 430. In some implementations, each of the ISFFs 515 included in the initial ISFF stage 530-1 (e.g., each ISFF 515 included in an initial upper-level ISFF scan chain) may be configured to receive input from a corresponding output component of an IC 505 (e.g., via a logic component), such as an output pin, an output pad, an output interface, an output bus, or another type of output component. For example, each D input in the initial upper-level ISFF scan chain may receive input from a corresponding output component of the IC 505 (e.g., via a logic component).

In some implementations, each of the ISFFs 515 included in the final ISFF stage 530-P (e.g., each ISFF 515 included in a final upper-level ISFF scan chain) may be configured to provide output to a logic component 510 that provides output to a CSFF stage (e.g., an initial upper-level CSFF stage 540-1). For example, each Q output in the final upper-level ISFF scan chain may be connected to a logic component 510 having outputs connected to an initial upper-level CSFF scan chain (e.g., connected to D inputs of the initial upper-level CSFF scan chain).

In some implementations, each of the ISFFs 515 included in an intermediate upper-level ISFF stage (e.g., each ISFF 515 included in an intermediate upper-level ISFF scan chain) may be configured to receive input from a logic component 510 that receives input from another upper-level ISFF stage (e.g., the initial upper-level ISFF stage 530-1 or another intermediate upper-level ISFF stage) and may be configured to provide output to a logic component 510 that provides output to another upper-level ISFF stage (e.g., the final upper-level ISFF stage 530-P or another intermediate upper-level ISFF stage). For example, each D input in an intermediate upper-level ISFF scan chain may be connected to a logic component 510 having inputs connected to Q outputs of a preceding upper-level ISFF scan chain (e.g., an initial upper-level ISFF scan chain or another intermediate upper-level ISFF scan chain), and each Q output in the intermediate upper-level ISFF scan chain may be connected to a logic component 510 having outputs connected to D inputs of a subsequent upper-level ISFF scan chain (e.g., a final upper-level ISFF scan chain or another intermediate upper-level ISFF scan chain).

In some implementations, the system 500 or an ISFF group 545 does not include any intermediate upper-level ISFF stages. For example, the system 500 and/or a first ISFF group 545-1 may include only two upper-level ISFF stages (e.g., P=2), such as a first upper-level ISFF stage that is the initial ISFF stage 530-1 and a second upper-level ISFF stage that is the final ISFF stage 530-P. In this case, each of the ISFFs 515 included in the initial ISFF stage 530-1 may be configured to provide output to a logic component 510 that provides output to the final ISFF stage 530-P, and each of the ISFFs 515 included in the final ISFF stage 530-P may be configured to receive input from that same logic component 510, which receives input from the initial ISFF stage 530-1. For example, each Q output in the initial upper-level ISFF scan chain may be connected to a logic component 510 having outputs connected to the D inputs of the final upper-level ISFF scan chain, and each D input in the final upper-level ISFF scan chain may be connected to that same logic component 510 having inputs connected to the Q outputs of the initial upper-level ISFF scan chain.

As another example, the OSFFs 525 may be arranged in a final OSFF stage 535-1, one or more intermediate OSFF stages (not shown), and an initial OSFF stage 535-R. In some implementations, each of the OSFFs 525 included in the final OSFF stage 535-1 (e.g., each OSFF 525 included in a final upper-level OSFF scan chain) may be configured to provide output to a corresponding input component of an IC 505 (e.g., via a logic component), such as an input pin, an input pad, an input interface, an input bus, or another type of input component. For example, each Q output in the final upper-level OSFF scan chain may provide output to a corresponding input component of the IC 505 (e.g., via a logic component).

In some implementations, each of the OSFFs 525 included in the initial OSFF stage 535-R (e.g., each OSFF 525 included in an initial upper-level OSFF scan chain) may be configured to receive input from a logic component 510 that receives input from a CSFF stage (e.g., a final CSFF stage 540-S). For example, each D input in the initial upper-level OSFF scan chain may be connected to a logic component 510 having inputs connected to a final upper-level CSFF scan chain (e.g., connected to Q outputs of the final upper-level CSFF scan chain).

In some implementations, each of the OSFFs 525 included in an intermediate upper-level OSFF stage (e.g., each OSFF 525 included in an intermediate upper-level OSFF scan chain) may be configured to receive input from a logic component 510 that receives input from another upper-level OSFF stage (e.g., the initial upper-level OSFF stage 535-R or another intermediate upper-level OSFF stage) and may be configured to provide output to a logic component 510 that provides output to another upper-level OSFF stage (e.g., the final upper-level OSFF stage 535-1 or another intermediate upper-level OSFF stage). For example, each D input in an intermediate upper-level OSFF scan chain may be connected to a logic component 510 having inputs connected to Q outputs of a preceding upper-level OSFF scan chain (e.g., an initial upper-level OSFF scan chain or another intermediate upper-level OSFF scan chain), and each Q output in the intermediate upper-level OSFF scan chain may be connected to a logic component 510 having outputs connected to D inputs of a subsequent upper-level OSFF scan chain (e.g., a final upper-level OSFF scan chain or another intermediate upper-level OSFF scan chain).

In some implementations, the system 500 or an OSFF group 550 does not include any intermediate upper-level OSFF stages. For example, the system 500 and/or a first OSFF group 550-1 may include only two upper-level OSFF stages (e.g., R=2), such as a first upper-level OSFF stage that is the final upper-level OSFF stage 535-1 and a second upper-level OSFF stage that is the initial upper-level OSFF stage 535-R. In this case, each of the OSFFs 525 included in the initial OSFF stage 535-R may be configured to provide output to a logic component 510 that provides output to the final OSFF stage 535-1, and each of the OSFFs 525 included in the final OSFF stage 535-1 may be configured to receive input from that same logic component 510, which receives input from the initial OSFF stage 535-R. For example, each Q output in the initial upper-level OSFF scan chain may be connected to a logic component 510 having outputs connected to the D inputs of the final upper-level OSFF scan chain, and each D input in the final upper-level OSFF scan chain may be connected to that same logic component 510 having inputs connected to the Q outputs of the initial upper-level OSFF scan chain.

In some implementations, the CSFFs 520 may be arranged in multiple stages, where each stage includes a separate scan chain from the other stages. For example, the CSFFs 520 may be arranged in an initial CSFF stage 540-1, a final CSFF stage 540-S, and one or more intermediate CSFF stages, which are not shown, but which are situated between the initial CSFF stage 540-1 and the final CSFF stage 540-S.

In some implementations, each of the CSFFs 520 included in the initial CSFF stage 540-1 (e.g., each CSFF 520 included in an initial upper-level CSFF scan chain) may be configured to receive input from a logic component 510 that receives input from an upper-level ISFF stage (e.g., the final ISFF stage 530-P). For example, each D input in the initial upper-level CSFF scan chain may be connected to a logic component 510 having inputs connected to a final upper-level ISFF scan chain (e.g., connected to Q outputs of the final upper-level ISFF scan chain).

In some implementations, each of the CSFFs 520 included in the final CSFF stage 540-S (e.g., each CSFF 520 included in a final upper-level CSFF scan chain) may be configured to provide output to a logic component 510 that provides output to an upper-level OSFF stage (e.g., an initial OSFF stage 535-R). For example, each Q output in the final upper-level CSFF scan chain may be connected to a logic component 510 having outputs connected to an initial upper-level OSFF scan chain (e.g., connected to D inputs of the initial upper-level OSFF scan chain).

In some implementations, each of the CSFFs 520 included in an intermediate upper-level CSFF stage (e.g., each CSFF 520 included in an intermediate upper-level CSFF scan chain) may be configured to receive input from a logic component 510 that receives input from another upper-level CSFF stage (e.g., the initial upper-level CSFF stage 540-1 or another intermediate upper-level CSFF stage) and may be configured to provide output to a logic component 510 that provides output to another upper-level CSFF stage (e.g., the final upper-level CSFF stage 540-S or another intermediate upper-level CSFF stage). For example, each D input in an intermediate upper-level CSFF scan chain may be connected to a logic component 510 having inputs connected to Q outputs of a preceding upper-level CSFF scan chain (e.g., an initial upper-level CSFF scan chain or another intermediate upper-level CSFF scan chain), and each Q output in the intermediate upper-level CSFF scan chain may be connected to a logic component 510 having outputs connected to D inputs of a subsequent upper-level CSFF scan chain (e.g., a final upper-level CSFF scan chain or another intermediate upper-level CSFF scan chain).

In some implementations, the system 500 may include only a single upper-level stage (e.g., between ICs 505). In this case, the single stage may be considered as an ISFF stage or an OSFF stage without any CSFF stages for the system 500. However, the system 500 may include a large number of upper-level CSFF scan chains, such as the initial CSFF stage 540-1, the final CSFF stage 540-S, and several, tens, hundreds, or thousands of intermediate upper-level CSFF stages, depending on the complexity and design of the system 500.

In some implementations, each of the scan flip-flops included in the system 500 (e.g., each ISFF 515, each CSFF 520, and each OSFF 525) consist of a scan flip-flop 100 with no other components. For example, in some implementations, the ISFFs 515 of the system 500 do not include the internal test mode multiplexer 350 described above in connection with FIG. 3. Similarly, in some implementations, the OSFFs 525 of the system 500 do not include the external test mode multiplexer 355 described above in connection with FIG. 3. This may reduce complexity of the system 500 and may enable all scan flip-flops of the system 500 to operate at the functional clock frequency for an at-speed test. In some implementations, none of the ISFFs 515 are test-dedicated scan flip-flops. In other words, all of the ISFFs 515 may be capable of operating in a functional mode and in a test mode. For example, all, of the ISFFs 515 may be shared scan flip-flops, such as the shared scan flip-flop 120 of FIG. 1. Similarly, in some implementations, none of the OSFFs 525 are test-dedicated scan flip-flops. In other words, all of the OSFFs 525 may be capable of operating in a functional mode and in a test mode. For example, all, of the OSFFs 525 may be shared scan flip-flops, such as the shared scan flip-flop 120 of FIG. 1. This may increase functional test coverage and reduce complexity of the system 500 as compared to a system that includes one or more test-dedicated scan flip-flops.

As further shown, the system may include a system-level testing component 555. The system-level testing component 555 may be configured to perform a scan test, a chain test, a BIST (e.g., a logic BIST, or LBIST), an EDT, and/or a CODEC test. In some implementations, the system-level testing component 555 includes a system-level core testing component and an interface testing component. The system-level core testing component may be configured to perform a core test of the system 500. In some implementations, the ISFFs 415, the CSFFs 420, and the OSFFs 425 of the ICs 505 (and the ICs 405) are not accessible to the system-level core testing component. The interface testing component may be configured to perform one or more interface tests, such as an interface test of an interface between ICs 505 and/or an interface test of an interface between an IC 505 and the system 500. In some implementations, the ISFFs 415 and the OSFFS 425 of the ICs 505 (and the ICs 405) are accessible to the interface testing component, and the CSFFs 420 of the ICs 505 (and the ICs 405) are not accessible to the interface testing component.

The testing component 555 (e.g., a system-level core testing component of the testing component 555) may be configured to perform a core test of logic components 510 of the system 500 by loading test data into each upper-level ISFF stage included in an ISFF group 545 situated before logic component(s) 510 to be tested, each upper-level CSFF stage situated between logic component(s) 510 to be tested, and each upper-level OSFF stage included in an OSFF group 550 situated after logic component(s) 510 to be tested. The testing component 555 may set the SE signal for the scan chains to be loaded to high (1) to load the test data, and may pulse a clock signal multiple times using a slow clock frequency to propagate the test data through those scan chains (e.g., the scan chains of the ISFF stages 530, the OSFF stages 535, and the CSFF stages 540). The testing component 555 may then set the SE signal for the loaded scan chains to low (0) and pulse a clock signal multiple times using the functional clock frequency to perform an at-speed test (or may pulse the clock signal multiple times using the slow clock frequency for a stuck-at test). A test result may be captured by each upper-level ISFF stage, each upper-level CSFF stage, and each upper-level OSFF stage. The test result may correspond to a test pattern that was loaded into the one or more stages. The testing component 555 may obtain the test result and may compare the test result to a corresponding expected result (e.g., an expected result that corresponds to a test pattern that results in that test result) to determine whether the logic components 510 between ICs 505 are properly functioning.

The testing component 555 (e.g., an interface testing component of the testing component 555) may be configured to perform an interface test of a first interface 560, such as an input interface to an IC 505, between the system 500 (e.g., an upper-level component of the system 500) and the IC 505 (e.g., a lower-level component of the system 500) by loading test data into each upper-level OSFF stage situated before the first interface 560 and each lower-level ISFF stage situated after the first interface 560. The testing component 555 may set the SE signal for the scan chains to be loaded to high (1) to load the test data, and may pulse a clock signal multiple times using a slow clock frequency to propagate the test data through those scan chains (e.g., the scan chains of each upper-level OSFF stage situated before the first interface 560 and each lower-level ISFF stage situated after the first interface 560). The testing component 555 may then set the SE signal for the loaded scan chains to low (0) and pulse a clock signal multiple times using the functional clock frequency to perform an at-speed test of the first interface 560 (or may pulse the clock signal multiple times using the slow clock frequency for a stuck-at test of the first interface 560). A test result may be captured by each upper-level OSFF stage situated before the first interface 560 and each lower-level ISFF stage situated after the first interface 560. The test result may correspond to a test pattern that was loaded into the one or more stages. The testing component 555 may obtain the test result and may compare the test result to a corresponding expected result (e.g., an expected result that corresponds to a test pattern that results in that test result) to determine whether the first interface 560 between the system 500 and the IC 505 is properly functioning.

The testing component 555 (e.g., an interface testing component of the testing component 555) may be configured to perform an interface test of a second interface 565, such as an output interface to an IC 505, between the system 500 (e.g., an upper-level component of the system 500) and the IC 505 (e.g., a lower-level component of the system 500) by loading test data into each lower-level OSFF stage situated before the second interface 565 and each upper-level ISFF stage situated after the second interface 565. The testing component 555 may set the SE signal for the scan chains to be loaded to high (1) to load the test data, and may pulse a clock signal multiple times using a slow clock frequency to propagate the test data through those scan chains (e.g., the scan chains of each lower-level OSFF stage situated before the second interface 565 and each upper-level ISFF stage situated after the second interface 565). The testing component 555 may then set the SE signal for the loaded scan chains to low (0) and pulse a clock signal multiple times using the functional clock frequency to perform an at-speed test of the second interface 565 (or may pulse the clock signal multiple times using the slow clock frequency for a stuck-at test of the second interface 565). A test result may be captured by each lower-level OSFF stage situated before the second interface 565 and each upper-level ISFF stage situated after the second interface 565. The test result may correspond to a test pattern that was loaded into the one or more stages. The testing component 555 may obtain the test result and may compare the test result to a corresponding expected result (e.g., an expected result that corresponds to a test pattern that results in that test result) to determine whether the second interface 565 between the system 500 and the IC 505 is properly functioning.

In some implementations, the testing component 555 (e.g., an interface testing component of the testing component 555) may be configured to perform an interface test of both the first interface 560 (as well as the logical component(s) 510 between OSFF stages 535 prior to the first interface 560, and the logical component(s) 450 between ISFF stages 430 after the first interface 560) and the second interface 565 (as well as the logical component(s) 510 between ISFF stages 530 after the second interface 565, and the logical component(s) 450 between OSFF stages 435 prior to the second interface 565) by loading test data into each upper-level OSFF stage situated before the first interface 560, each lower-level ISFF stage situated after the first interface 560, each lower-level OSFF stage situated before the second interface 565, and each upper-level ISFF stage situated after the second interface 565. The testing component 555 may set the SE signal for the scan chains to be loaded to high (1) to load the test data, and may pulse a clock signal multiple times using a slow clock frequency to propagate the test data through those scan chains (e.g., the scan chains of each upper-level OSFF stage situated before the first interface 560, each lower-level ISFF stage situated after the first interface 560, each lower-level OSFF stage situated before the second interface 565, and each upper-level ISFF stage situated after the second interface 565). The testing component 555 may then set the SE signal for the loaded scan chains to low (0) and pulse a clock signal multiple times using the functional clock frequency to perform an at-speed test (or may pulse the clock signal multiple times using the slow clock frequency for a stuck-at test). A test result may be captured by each upper-level OSFF stage situated before the first interface 560, each lower-level ISFF stage situated after the first interface 560, each lower-level OSFF stage situated before the second interface 565, and each upper-level ISFF stage situated after the second interface 565. The test result may correspond to a test pattern that was loaded into the one or more stages. The testing component 555 may obtain the test result and may compare the test result to a corresponding expected result (e.g., an expected result that corresponds to a test pattern that results in that test result) to determine whether the first interface 560 and the second interface 565 between the system 500 and the IC 505 is properly functioning.

By using multiple stages of ISFFs and/or OSFFs, an at-speed test can be performed with launching of test data from the D path to the Q path using the functional clock frequency and scan enable set to low because each ISFF and OSFF is capable of operating in a functional mode and a test mode (as compared to a test-dedicated core wrapper flop, which can only operate in a test mode and thus can only launch test data from an SI path to the Q path using the slow clock frequency and scan enable set to high). This reduces timing overhead associated with at-speed testing of an IC and/or a system. This may also reduce complexity of the system by enabling transmission of the same SE signal to a launching scan chain and a capture scan chain as compared to the architecture 300 where different SE signals need to be sent to launching scan chains versus capture scan chains. Furthermore, the architecture described in connection with FIG. 5 does not require inverting Q outputs and does not require shifting scan chains from the Q signal to the SI signal of the next wrapper flop at a high functional clock frequency in at-speed capture, thereby reducing design complexity (e.g., for a stuck-at test mode and an at-speed test mode), improving test coverage (e.g., for a stuck-at test mode and an at-speed test mode), reducing pattern count inflation (e.g., for a stuck-at test mode and an at-speed test mode with respect to a loopback mode for a shared or dedicated core wrapper flip-flop), and reducing timing overhead (e.g., for an at-speed test mode with respect to a non-loopback mode for a shared core wrapper flip-flop).

As indicated above, FIG. 5 is provided as an example. Other examples may differ from what is described with regard to FIG. 5.

Figure 6:
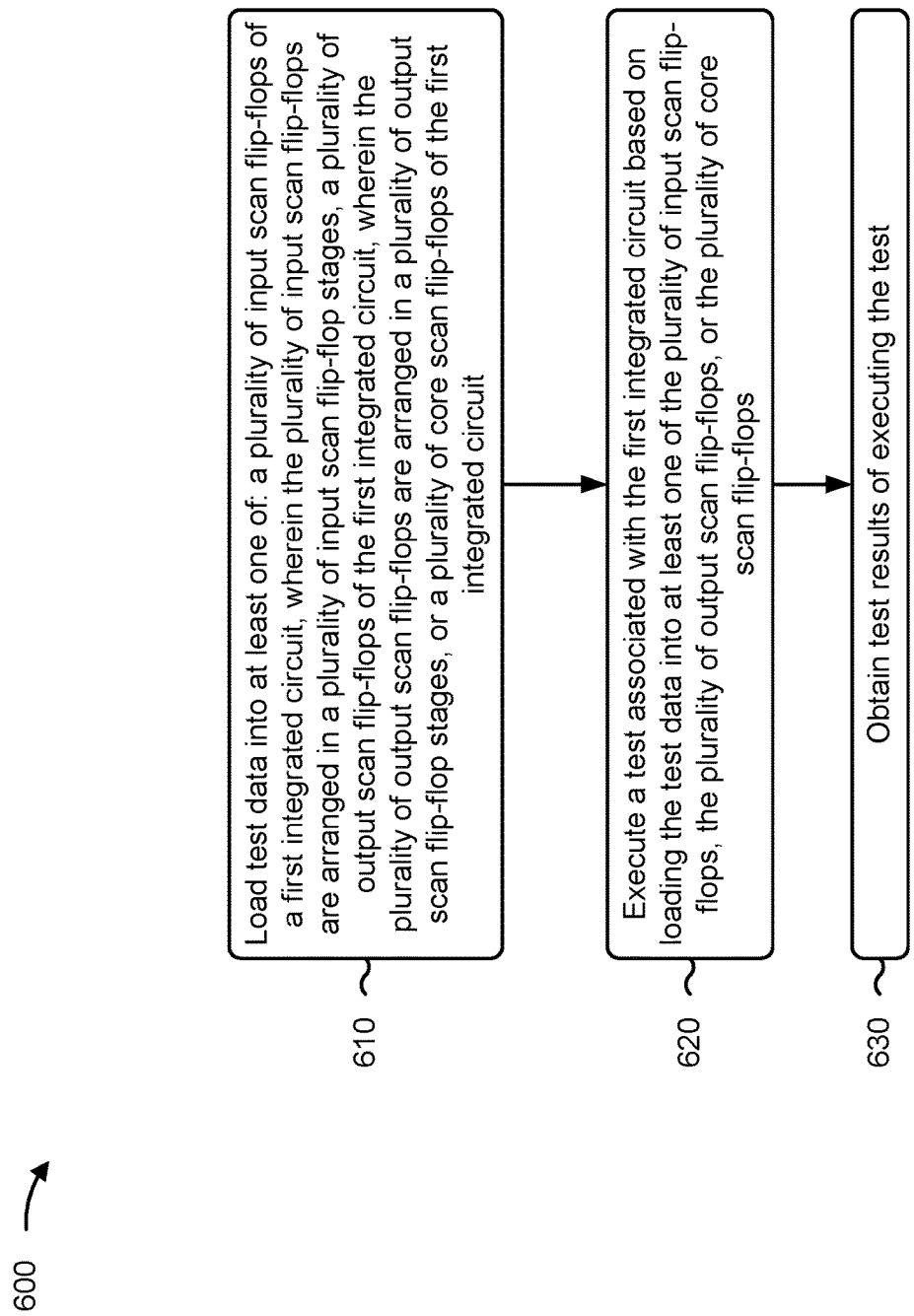
FIG. 6 is a flowchart of an example method associated with core and interface scan testing.

FIG. 6 is a flowchart of an example method 600 associated with core and interface scan testing. In some implementations, a system (e.g., system 500) may perform or may be configured to perform one or more process blocks of FIG. 6. In some implementations, another device or a group of devices separate from or including the system (e.g., automated test equipment) may perform or may be configured to perform one or more process blocks of FIG. 6. Additionally, or alternatively, one or more components of the system (e.g., an integrated circuit 405, an integrated circuit 505, a testing component 455, and/or a testing component 555) may perform or may be configured to perform one or more process blocks of FIG. 6.

As shown in FIG. 6, the method 600 may include loading test data into at least one of: a plurality of input scan flip-flops of a first integrated circuit, wherein the plurality of input scan flip-flops are arranged in a plurality of input scan flip-flop stages, a plurality of output scan flip-flops of the first integrated circuit, wherein the plurality of output scan flip-flops are arranged in a plurality of output scan flip-flop stages, or a plurality of core scan flip-flops of the first integrated circuit (block 610). As further shown in FIG. 6, the method 600 may include executing a test associated with the first integrated circuit based on loading the test data into at least one of the plurality of input scan flip-flops, the plurality of output scan flip-flops, or the plurality of core scan flip-flops (block 620). As further shown in FIG. 6, the method 600 may include obtaining test results of executing the test (block 630).

The method 600 may include additional implementations, such as any single implementation or any combination of implementations described below and/or in connection with one or more other methods described elsewhere herein.

In some implementations, a first stage of core scan flip-flops, included in the plurality of core scan flip-flops, are connected to a final input scan flip-flop stage of the plurality of input scan flip-flop stages. In some implementations, a second stage of core scan flip-flops, included in the plurality of core scan flip-flops, are connected to an initial output scan flip-flop stage of the plurality of output scan flip-flop stages.

In some implementations, loading the test data comprises loading the test data into the plurality of input scan flip-flops, the plurality of core scan flip-flops, and the plurality of output scan flip-flops, executing the test comprises executing a core test of the first integrated circuit, and obtaining the test results comprises obtaining the test results from the plurality of input scan flip-flops, the plurality of core scan flip-flops, and the plurality of output scan flip-flops based on executing the core test of the first integrated circuit.

In some implementations, loading the test data comprises loading the test data into the plurality of output scan flip-flops of the first integrated circuit and a plurality of input scan flip-flops of a second integrated circuit, executing the test comprises executing an interface test to test an interface between the first integrated circuit and the second integrated circuit, and obtaining the test results comprises obtaining the test results from the plurality of output scan flip-flops of the first integrated circuit and the plurality of input scan flip-flops of the second integrated circuit based on executing the interface test.

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein, such as the operations described in connection with FIGS. 4-5.

Figure 7:
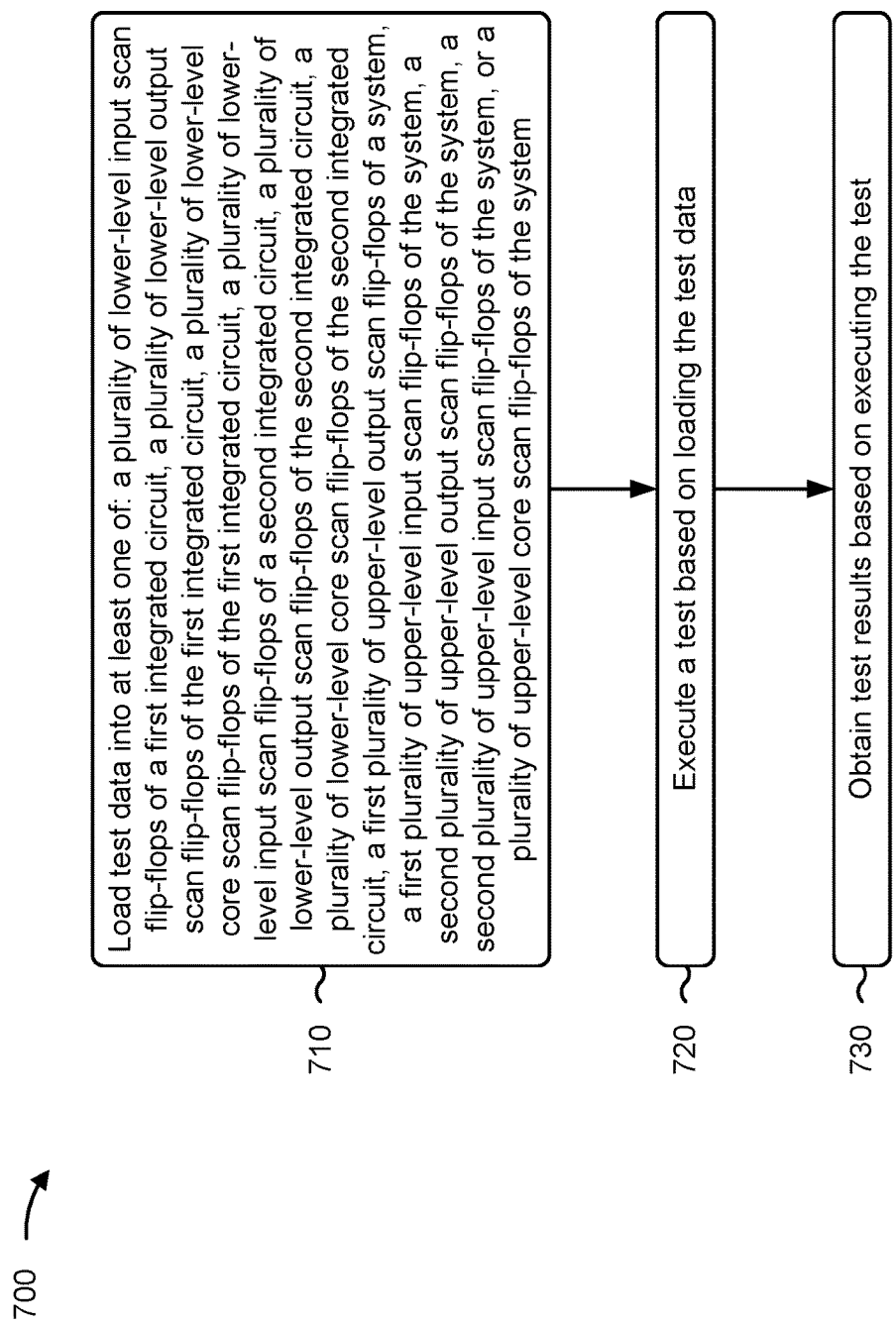
FIG. 7 is a flowchart of another example method associated with core and interface scan testing.

FIG. 7 is a flowchart of an example method 700 associated with core and interface scan testing. In some implementations, a system (e.g., system 500) may perform or may be configured to perform one or more process blocks of FIG. 7. In some implementations, another device or a group of devices separate from or including the system (e.g., automated test equipment) may perform or may be configured to perform one or more process blocks of FIG. 7. Additionally, or alternatively, one or more components of the system (e.g., an integrated circuit 405, an integrated circuit 505, a testing component 455, and/or a testing component 555) may perform or may be configured to perform one or more process blocks of FIG. 7.

As shown in FIG. 7, the method 700 may include loading test data into at least one of: a plurality of lower-level input scan flip-flops of a first integrated circuit, a plurality of lower-level output scan flip-flops of the first integrated circuit, a plurality of lower-level core scan flip-flops of the first integrated circuit, a plurality of lower-level input scan flip-flops of a second integrated circuit, a plurality of lower-level output scan flip-flops of the second integrated circuit, a plurality of lower-level core scan flip-flops of the second integrated circuit, a first plurality of upper-level output scan flip-flops of the system, a first plurality of upper-level input scan flip-flops of the system, a second plurality of upper-level output scan flip-flops of the system, a second plurality of upper-level input scan flip-flops of the system, or a plurality of upper-level core scan flip-flops of the system (block 710). As further shown in FIG. 7, the method 700 may include executing a test based on loading the test data (block 720). As further shown in FIG. 7, the method 700 may include obtaining test results based on executing the test (block 730).

The method 700 may include additional implementations, such as any single implementation or any combination of implementations described below and/or in connection with one or more other methods described elsewhere herein.

In some implementations, the plurality of lower-level input scan flip-flops of the first integrated circuit are arranged in a plurality of stages. In some implementations, the plurality of lower-level output scan flip-flops of the first integrated circuit are arranged in a plurality of stages. In some implementations, the plurality of lower-level input scan flip-flops of the second integrated circuit are arranged in a plurality of stages. In some implementations, the plurality of lower-level output scan flip-flops of the second integrated circuit are arranged in a plurality of stages.

In some implementations, the first plurality of upper-level output scan flip-flops are arranged in a plurality of stages that includes a final stage that is connected to inputs of the first integrated circuit. In some implementations, the first plurality of upper-level input scan flip-flops are arranged in a plurality of stages that includes an initial stage that is connected to outputs of the first integrated circuit.

In some implementations, the second plurality of upper-level output scan flip-flops are arranged in a plurality of stages that includes a final stage that is connected to inputs of the second integrated circuit. In some implementations, the second plurality of upper-level input scan flip-flops are arranged in a plurality of stages that includes an initial stage that is connected to outputs of the second integrated circuit.

In some implementations, loading the test data comprises loading the test data into the plurality of lower-level input scan flip-flops of the first integrated circuit, the plurality of lower-level core scan flip-flops of the first integrated circuit, and the plurality of lower-level output scan flip-flops of the first integrated circuit, executing the test comprises executing a core test of the first integrated circuit, and obtaining the test results comprises obtaining the test results from the plurality of lower-level input scan flip-flops of the first integrated circuit, the plurality of lower-level core scan flip-flops of the first integrated circuit, and the plurality of lower-level output scan flip-flops of the first integrated circuit based on executing the core test of the first integrated circuit.

In some implementations, loading the test data comprises loading the test data into the plurality of lower-level input scan flip-flops of the second integrated circuit, the plurality of lower-level core scan flip-flops of the second integrated circuit, and the plurality of lower-level output scan flip-flops of the second integrated circuit, executing the test comprises executing a core test of the second integrated circuit, and obtaining the test results comprises obtaining the test results from the plurality of lower-level input scan flip-flops of the second integrated circuit, the plurality of lower-level core scan flip-flops of the second integrated circuit, and the plurality of lower-level output scan flip-flops of the second integrated circuit based on executing the core test of the second integrated circuit.

In some implementations, loading the test data comprises loading the test data into the first plurality of upper-level input scan flip-flops of the system, the plurality of upper-level core scan flip-flops of the system, and the second plurality of upper-level output scan flip-flops of the system, executing the test comprises executing a core test of the system, and obtaining the test results comprises obtaining the test results from the first plurality of upper-level input scan flip-flops of the system, the plurality of upper-level core scan flip-flops of the system, and the second plurality of upper-level output scan flip-flops of the system based on executing the core test of the system.

In some implementations, loading the test data comprises loading the test data into the first plurality of upper-level output scan flip-flops of the system, the first plurality of upper-level input scan flip-flops of the system, the plurality of lower-level input scan flip-flops of the first integrated circuit, and the plurality of lower-level output scan flip-flops of the first integrated circuit, executing the test comprises executing an interface test of one or more interfaces between the system and the first integrated circuit, and obtaining the test results comprises obtaining the test results from the first plurality of upper-level output scan flip-flops of the system, the first plurality of upper-level input scan flip-flops of the system, the plurality of lower-level input scan flip-flops of the first integrated circuit, and the plurality of lower-level output scan flip-flops of the first integrated circuit based on executing the interface test.

Although FIG. 7 shows example blocks of a method 700, in some implementations, the method 700 may include additional blocks, fewer blocks, different blocks, or differently arranged blocks than those depicted in FIG. 7. Additionally, or alternatively, two or more of the blocks of the method 700 may be performed in parallel. The method 700 is an example of one method that may be performed by one or more devices described herein. These one or more devices may perform or may be configured to perform one or more other methods based on operations described herein, such as the operations described in connection with FIGS. 4-5.

In some implementations, an integrated circuit includes a plurality of input scan flip-flops arranged in a plurality of input scan flip-flop stages that includes at least a first input scan flip-flop stage and a second input scan flip-flop stage, wherein inputs to a first plurality of input scan flip-flops included in the first input scan flip-flop stage are connected to inputs of the integrated circuit, and wherein inputs to a second plurality of input scan flip-flops included in the second input scan flip-flop stage are connected to outputs of a logic component that is connected to outputs of the first plurality of input scan flip-flops; and a plurality of output scan flip-flops arranged in a plurality of output scan flip-flop stages that includes at least a first output scan flip-flop stage and a second output scan flip-flop stage, wherein outputs from a first plurality of output scan flip-flops included in the first output scan flip-flop stage are connected to outputs of the integrated circuit, and wherein outputs from a second plurality of output scan flip-flops included in the second output scan flip-flop stage are connected to inputs of a logic component that is connected to inputs of the first plurality of output scan flip-flops.

In some implementations, a system includes a plurality of integrated circuits, wherein each integrated circuit, included in the plurality of integrated circuits, includes: a plurality of lower-level input scan flip-flops arranged in a plurality of lower-level input scan flip-flop stages that includes at least a first lower-level input scan flip-flop stage and a second lower-level input scan flip-flop stage, wherein inputs to a first plurality of lower-level input scan flip-flops included in the first lower-level input scan flip-flop stage are connected to inputs of a corresponding integrated circuit, of the plurality of integrated circuits, that includes the plurality of lower-level input scan flip-flops, and wherein inputs to a second plurality of lower-level input scan flip-flops included in the second lower-level input scan flip-flop stage are connected to outputs of a logic component that is connected to outputs of the first plurality of lower-level input scan flip-flops; a plurality of lower-level output scan flip-flops arranged in a plurality of lower-level output scan flip-flop stages that includes at least a first lower-level output scan flip-flop stage and a second lower-level output scan flip-flop stage, wherein outputs from a first plurality of lower-level output scan flip-flops included in the first lower-level output scan flip-flop stage are connected to outputs of the corresponding integrated circuit, and wherein outputs from a second plurality of lower-level output scan flip-flops included in the second lower-level output scan flip-flop stage are connected to inputs of a logic component that is connected to inputs of the first plurality of lower-level output scan flip-flops; and a plurality of lower-level core scan flip-flops, wherein a first stage of lower-level core scan flip-flops, included in the plurality of lower-level core scan flip-flops, are connected to a final lower-level input scan flip-flop stage of the plurality of lower-level input scan flip-flop stages, and wherein a second stage of lower-level core scan flip-flops, included in the plurality of lower-level core scan flip-flops, are connected to an initial lower-level output scan flip-flop stage of the plurality of lower-level output scan flip-flop stages.

In some implementations, a method includes loading test data into at least one of: a plurality of input scan flip-flops of a first integrated circuit, wherein the plurality of input scan flip-flops are arranged in a plurality of input scan flip-flop stages, a plurality of output scan flip-flops of the first integrated circuit, wherein the plurality of output scan flip-flops are arranged in a plurality of output scan flip-flop stages, or a plurality of core scan flip-flops of the first integrated circuit, wherein a first stage of core scan flip-flops, included in the plurality of core scan flip-flops, are connected to a final input scan flip-flop stage of the plurality of input scan flip-flop stages, and wherein a second stage of core scan flip-flops, included in the plurality of core scan flip-flops, are connected to an initial output scan flip-flop stage of the plurality of output scan flip-flop stages; executing a test associated with the first integrated circuit based on loading the test data into at least one of the plurality of input scan flip-flops, the plurality of output scan flip-flops, or the plurality of core scan flip-flops; and obtaining test results of executing the test.

In some implementations, a method includes loading, by a system that includes a first integrated circuit and a second integrated circuit, test data into at least one of: a plurality of lower-level input scan flip-flops of the first integrated circuit, wherein the plurality of lower-level input scan flip-flops of the first integrated circuit are arranged in a plurality of stages, a plurality of lower-level output scan flip-flops of the first integrated circuit, wherein the plurality of lower-level output scan flip-flops of the first integrated circuit are arranged in a plurality of stages, a plurality of lower-level core scan flip-flops of the first integrated circuit, a plurality of lower-level input scan flip-flops of the second integrated circuit, wherein the plurality of lower-level input scan flip-flops of the second integrated circuit are arranged in a plurality of stages, a plurality of lower-level output scan flip-flops of the second integrated circuit, wherein the plurality of lower-level output scan flip-flops of the second integrated circuit are arranged in a plurality of stages, a plurality of lower-level core scan flip-flops of the second integrated circuit, a first plurality of upper-level output scan flip-flops of the system, wherein the first plurality of upper-level output scan flip-flops are arranged in a plurality of stages that includes a final stage that is connected to inputs of the first integrated circuit, a first plurality of upper-level input scan flip-flops of the system, wherein the first plurality of upper-level input scan flip-flops are arranged in a plurality of stages that includes an initial stage that is connected to outputs of the first integrated circuit, a second plurality of upper-level output scan flip-flops of the system, wherein the second plurality of upper-level output scan flip-flops are arranged in a plurality of stages that includes a final stage that is connected to inputs of the second integrated circuit, a second plurality of upper-level input scan flip-flops of the system, wherein the second plurality of upper-level input scan flip-flops are arranged in a plurality of stages that includes an initial stage that is connected to outputs of the second integrated circuit, or a plurality of upper-level core scan flip-flops of the system; and executing, by the system, a test based on loading the test data into at least one of the plurality of lower-level input scan flip-flops of the first integrated circuit, the plurality of lower-level output scan flip-flops of the first integrated circuit, the plurality of lower-level core scan flip-flops of the first integrated circuit, the plurality of lower-level input scan flip-flops of the second integrated circuit, the plurality of lower-level output scan flip-flops of the second integrated circuit, the plurality of lower-level core scan flip-flops of the second integrated circuit, the first plurality of upper-level output scan flip-flops of the system, the first plurality of upper-level input scan flip-flops of the system, the second plurality of upper-level output scan flip-flops of the system, the second plurality of upper-level input scan flip-flops of the system, or the plurality of upper-level core scan flip-flops of the system; and obtaining, by the system, test results based on executing the test.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An integrated circuit, comprising:
    a plurality of input scan flip-flops arranged in a plurality of input scan flip-flop stages that includes at least a first input scan flip-flop stage and a second input scan flip-flop stage,
        wherein inputs to a first plurality of input scan flip-flops included in the first input scan flip-flop stage are connected to inputs of the integrated circuit, and
        wherein inputs to a second plurality of input scan flip-flops included in the second input scan flip-flop stage are connected to outputs of a logic component that is connected to outputs of the first plurality of input scan flip-flops; and
    a plurality of output scan flip-flops arranged in a plurality of output scan flip-flop stages that includes at least a first output scan flip-flop stage and a second output scan flip-flop stage,
        wherein outputs from a first plurality of output scan flip-flops included in the first output scan flip-flop stage are connected to outputs of the integrated circuit, and
        wherein outputs from a second plurality of output scan flip-flops included in the second output scan flip-flop stage are connected to inputs of a logic component that is connected to inputs of the first plurality of output scan flip-flops.

2. The integrated circuit of claim 1, further comprising a plurality of core scan flip-flops,
    wherein a first stage of core scan flip-flops, included in the plurality of core scan flip-flops, are connected to a final input scan flip-flop stage of the plurality of input scan flip-flop stages, and
    wherein a second stage of core scan flip-flops, included in the plurality of core scan flip-flops, are connected to an initial output scan flip-flop stage of the plurality of output scan flip-flop stages.

3. The integrated circuit of claim 2, wherein the final input scan flip-flop stage is the second input scan flip-flop stage.

4. The integrated circuit of claim 2, wherein the final input scan flip-flop stage is a different stage than the second input scan flip-flop stage.

5. The integrated circuit of claim 2, wherein the initial output scan flip-flop stage is the second output scan flip-flop stage.

6. The integrated circuit of claim 2, wherein the initial output scan flip-flop stage is a different stage than the second output scan flip-flop stage.

7. The integrated circuit of claim 2, further comprising a testing component configured to perform a core test of the integrated circuit by loading test data into the plurality of input scan flip-flops and the plurality of output scan flip-flops, pulsing a clock signal at a clock frequency one or more times, and obtaining test results from the plurality of input scan flip-flops and the plurality of output scan flip-flops.

8. The integrated circuit of claim 7, wherein the testing component, to load the test data into the plurality of input scan flip-flops and the plurality of output scan flip-flops, is configured to load the test data into each stage of the plurality of input scan flip-flop stages and each stage of the plurality of output scan flip-flop stages, and wherein the testing component, to obtain the test results, is configured to obtain the test results from each stage of the plurality of inputs scan flip-flop stages and each stage of the plurality of output scan flip-flop stages.

9. The integrated circuit of claim 1, wherein every scan flip-flop included in the plurality of input scan flip-flops and every scan flip-flop included in the plurality of output scan flip-flops is capable of operating in a functional mode and a test mode.

10. The integrated circuit of claim 1, wherein the integrated circuit is a first integrated circuit; and further comprising a testing component configured to perform an interface test of an interface between the first integrated circuit and a second integrated circuit by loading test data into the plurality of output scan flip-flops of the first integrated circuit and a plurality of input scan flip-flops of the second integrated circuit, pulsing a clock signal at a clock frequency one or more times, and obtaining test results from the plurality of output scan flip-flops of the first integrated circuit and the plurality of input scan flip-flops of the second integrated circuit.

11. A system, comprising:

a plurality of integrated circuits, wherein each integrated circuit, included in the plurality of integrated circuits, includes:

a plurality of lower-level input scan flip-flops arranged in a plurality of lower-level input scan flip-flop stages that includes at least a first lower-level input scan flip-flop stage and a second lower-level input scan flip-flop stage, wherein inputs to a first plurality of lower-level input scan flip-flops included in the first lower-level input scan flip-flop stage are connected to inputs of a corresponding integrated circuit, of the plurality of integrated circuits, that includes the plurality of lower-level input scan flip-flops, and wherein inputs to a second plurality of lower-level input scan flip-flops included in the second lower-level input scan flip-flop stage are connected to outputs of a logic component that is connected to outputs of the first plurality of lower-level input scan flip-flops;

a plurality of lower-level output scan flip-flops arranged in a plurality of lower-level output scan flip-flop stages that includes at least a first lower-level output scan flip-flop stage and a second lower-level output scan flip-flop stage, wherein outputs from a first plurality of lower-level output scan flip-flops included in the first lower-level output scan flip-flop stage are connected to outputs of the corresponding integrated circuit, and wherein outputs from a second plurality of lower-level output scan flip-flops included in the second lower-level output scan flip-flop stage are connected to inputs of a logic component that is connected to inputs of the first plurality of lower-level output scan flip-flops; and a plurality of lower-level core scan flip-flops, wherein a first stage of lower-level core scan flip-flops, included in the plurality of lower-level core scan flip-flops, are connected to a final lower-level input scan flip-flop stage of the plurality of lower-level input scan flip-flop stages, and wherein a second stage of lower-level core scan flip-flops, included in the plurality of lower-level core scan flip-flops, are connected to an initial lower-level output scan flip-flop stage of the plurality of lower-level output scan flip-flop stages.

12. The system of claim 11, further comprising a testing component configured to perform an interface test of an interface between two integrated circuits by:

loading test data into lower-level output scan flip-flops included in a first integrated circuit of the plurality of integrated circuits and into lower-level input scan flip-flops included in a second integrated circuit of the plurality of integrated circuits, and obtaining test results from the lower-level output scan flip-flops included in the first integrated circuit and the lower-level input scan flip-flops included in the second integrated circuit.

13. The system of claim 11, further comprising a testing component configured to perform a core test of the corresponding integrated circuit by:

loading test data into the plurality of lower-level input scan flip-flops, the plurality of lower-level core scan flip-flops, and the plurality of lower-level output scan flip-flops, and obtaining test results from the plurality of lower-level input scan flip-flops, the plurality of lower-level core scan flip-flops, and the plurality of lower-level output scan flip-flops.

14. The system of claim 11, further comprising, for each integrated circuit of the plurality of integrated circuits:

a plurality of upper-level input scan flip-flops arranged in a plurality of upper-level input scan flip-flop stages that includes at least a first upper-level input scan flip-flop stage and a second upper-level input scan flip-flop stage, wherein inputs to a first plurality of upper-level input scan flip-flops included in the first upper-level input scan flip-flop stage are connected to the outputs of the corresponding integrated circuit, and wherein inputs to a second plurality of upper-level input scan flip-flops included in the second upper-level input scan flip-flop stage are connected to outputs of a logic component that is connected to outputs of the first plurality of upper-level input scan flip-flops.

15. The system of claim 14, further comprising, for each integrated circuit of the plurality of integrated circuits:

a plurality of upper-level output scan flip-flops arranged in a plurality of upper-level output scan flip-flop stages that includes at least a first upper-level output scan flip-flop stage and a second upper-level output scan flip-flop stage, wherein outputs from a first plurality of upper-level output scan flip-flops included in the first upper-level output scan flip-flop stage are connected to the inputs of the corresponding integrated circuit, and wherein outputs from a second plurality of upper-level output scan flip-flops included in the second upper-level output scan flip-flop stage are connected to inputs of a logic component that is connected to inputs of the first plurality of upper-level output scan flip-flops.

16. The system of claim 15, further comprising a testing component configured to perform an interface test of the system based on at least one of:

loading test data into the plurality of upper-level output scan flip-flops and the plurality of lower-level input scan flip-flops and obtaining test results from the plurality of upper-level output scan flip-flops and the plurality of lower-level input scan flip-flops, or loading test data into the plurality of lower-level output scan flip-flops and the plurality of upper-level input scan flip-flops and obtaining test results from the plurality of lower-level output scan flip-flops and the plurality of upper-level input scan flip-flops.

17. The system of claim 15, further comprising a plurality of upper-level core scan flip-flops,
wherein a first stage of upper-level core scan flip-flops, included in the plurality of upper-level core scan flip-flops, are connected to a final upper-level input scan flip-flop stage of the plurality of upper-level input scan flip-flop stages, and
wherein a second stage of upper-level core scan flip-flops, included in the plurality of upper-level core scan flip-flops, are connected to an initial upper-level output scan flip-flop stage of the plurality of upper-level output scan flip-flop stages.

18. The system of claim 17, further comprising a testing component configured to perform a core test of the system by loading test data into the plurality of upper-level input scan flip-flops, the plurality of upper-level core scan flip-flops, and the plurality of upper-level output scan flip-flops and obtaining test results from the plurality of upper-level input scan flip-flops, the plurality of upper-level core scan flip-flops, and the plurality of upper-level output scan flip-flops.

19. A method, comprising:
loading test data into at least one of:
a plurality of input scan flip-flops of a first integrated circuit, wherein the plurality of input scan flip-flops are arranged in a plurality of input scan flip-flop stages,
a plurality of output scan flip-flops of the first integrated circuit, wherein the plurality of output scan flip-flops are arranged in a plurality of output scan flip-flop stages, or
a plurality of core scan flip-flops of the first integrated circuit,
wherein a first stage of core scan flip-flops, included in the plurality of core scan flip-flops, are connected to a final input scan flip-flop stage of the plurality of input scan flip-flop stages, and
wherein a second stage of core scan flip-flops, included in the plurality of core scan flip-flops, are connected to an initial output scan flip-flop stage of the plurality of output scan flip-flop stages;
executing a test associated with the first integrated circuit based on loading the test data into at least one of the plurality of input scan flip-flops, the plurality of output scan flip-flops, or the plurality of core scan flip-flops; and
obtaining test results of executing the test.

20. The method of claim 19, wherein loading the test data comprises loading the test data into the plurality of input scan flip-flops, the plurality of core scan flip-flops, and the plurality of output scan flip-flops,
wherein executing the test comprises executing a core test of the first integrated circuit, and
wherein obtaining the test results comprises obtaining the test results from the plurality of input scan flip-flops, the plurality of core scan flip-flops, and the plurality of output scan flip-flops based on executing the core test of the first integrated circuit.

21. The method of claim 19, wherein loading the test data comprises loading the test data into the plurality of output scan flip-flops of the first integrated circuit and a plurality of input scan flip-flops of a second integrated circuit,
wherein executing the test comprises executing an interface test to test an interface between the first integrated circuit and the second integrated circuit, and
wherein obtaining the test results comprises obtaining the test results from the plurality of output scan flip-flops of the first integrated circuit and the plurality of input scan flip-flops of the second integrated circuit based on executing the interface test.

22. A method, comprising:
loading, by a system that includes a first integrated circuit and a second integrated circuit, test data into at least one of:
a plurality of lower-level input scan flip-flops of the first integrated circuit, wherein the plurality of lower-level input scan flip-flops of the first integrated circuit are arranged in a plurality of stages,
a plurality of lower-level output scan flip-flops of the first integrated circuit, wherein the plurality of lower-level output scan flip-flops of the first integrated circuit are arranged in a plurality of stages,
a plurality of lower-level core scan flip-flops of the first integrated circuit,
a plurality of lower-level input scan flip-flops of the second integrated circuit, wherein the plurality of lower-level input scan flip-flops of the second integrated circuit are arranged in a plurality of stages,
a plurality of lower-level output scan flip-flops of the second integrated circuit, wherein the plurality of lower-level output scan flip-flops of the second integrated circuit are arranged in a plurality of stages,
a plurality of lower-level core scan flip-flops of the second integrated circuit,
a first plurality of upper-level output scan flip-flops of the system, wherein the first plurality of upper-level output scan flip-flops are arranged in a plurality of stages that includes a final stage that is connected to inputs of the first integrated circuit,
a first plurality of upper-level input scan flip-flops of the system, wherein the first plurality of upper-level input scan flip-flops are arranged in a plurality of stages that includes an initial stage that is connected to outputs of the first integrated circuit,
a second plurality of upper-level output scan flip-flops of the system, wherein the second plurality of upper-level output scan flip-flops are arranged in a plurality of stages that includes a final stage that is connected to inputs of the second integrated circuit,
a second plurality of upper-level input scan flip-flops of the system, wherein the second plurality of upper-level input scan flip-flops are arranged in a plurality of stages that includes an initial stage that is connected to outputs of the second integrated circuit, or
a plurality of upper-level core scan flip-flops of the system; and
executing, by the system, a test based on loading the test data into at least one of the plurality of lower-level input scan flip-flops of the first integrated circuit, the plurality of lower-level output scan flip-flops of the first integrated circuit, the plurality of lower-level core scan flip-flops of the first integrated circuit, the plurality of lower-level input scan flip-flops of the second integrated circuit, the plurality of lower-level output scan flip-flops of the second integrated circuit, the plurality of lower-level core scan flip-flops of the second integrated circuit, the first plurality of upper-level output scan flip-flops of the system, the first plurality of upper-level input scan flip-flops of the system, the second plurality of upper-level output scan flip-flops of the system, the second plurality of upper-level input scan flip-flops of the system, or the plurality of upper-level core scan flip-flops of the system; and obtaining, by the system, test results based on executing the test.

23. The method of claim 22, wherein loading the test data comprises loading the test data into the plurality of lower-level input scan flip-flops of the first integrated circuit, the plurality of lower-level core scan flip-flops of the first integrated circuit, and the plurality of lower-level output scan flip-flops of the first integrated circuit, wherein executing the test comprises executing a core test of the first integrated circuit, and wherein obtaining the test results comprises obtaining the test results from the plurality of lower-level input scan flip-flops of the first integrated circuit, the plurality of lower-level core scan flip-flops of the first integrated circuit, and the plurality of lower-level output scan flip-flops of the first integrated circuit based on executing the core test of the first integrated circuit.

24. The method of claim 22, wherein loading the test data comprises loading the test data into the first plurality of upper-level input scan flip-flops of the system, the plurality of upper-level core scan flip-flops of the system, and the second plurality of upper-level output scan flip-flops of the system, wherein executing the test comprises executing a core test of the system, and wherein obtaining the test results comprises obtaining the test results from the first plurality of upper-level input scan flip-flops of the system, the plurality of upper-level core scan flip-flops of the system, and the second plurality of upper-level output scan flip-flops of the system based on executing the core test of the system.

25. The method of claim 22, wherein loading the test data comprises loading the test data into the first plurality of upper-level output scan flip-flops of the system, the first plurality of upper-level input scan flip-flops of the system, the plurality of lower-level input scan flip-flops of the first integrated circuit, and the plurality of lower-level output scan flip-flops of the first integrated circuit, wherein executing the test comprises executing an interface test of one or more interfaces between the system and the first integrated circuit, and wherein obtaining the test results comprises obtaining the test results from the first plurality of upper-level output scan flip-flops of the system, the first plurality of upper-level input scan flip-flops of the system, the plurality of lower-level input scan flip-flops of the first integrated circuit, and the plurality of lower-level output scan flip-flops of the first integrated circuit based on executing the interface test.

\* \* \* \* \*